(12) United States Patent
Sayama

(10) Patent No.: US 6,667,206 B2
(45) Date of Patent: Dec. 23, 2003

(54) METHOD OF MANUFACTURING SEMICONDUCTOR DEVICE

(75) Inventor: Hirokazu Sayama, Chiyoda-ku (JP)

(73) Assignee: Renesas Technology Corp., Tokyo (JP)

( * ) Notice: Subject to any disclaimer, the term of this patent is extended or adjusted under 35 U.S.C. 154(b) by 25 days.

(21) Appl. No.: 09/796,597

(22) Filed: Mar. 2, 2001

(65) Prior Publication Data

US 2002/0031883 A1 Mar. 14, 2002

(30) Foreign Application Priority Data

Sep. 1, 2000 (JP) .................................... P2000-265567

(51) Int. Cl.⁷ .......................................... H01L 21/8238
(52) U.S. Cl. ....................................... 438/231; 438/229
(58) Field of Search ................................ 438/231, 232, 438/230, 229, 199, 200, 275

(56) References Cited

U.S. PATENT DOCUMENTS

| | | | | |
|---|---|---|---|---|
| 5,153,144 A | * | 10/1992 | Komori et al. | 438/264 |
| 5,405,791 A | * | 4/1995 | Ahmad et al. | 438/231 |
| 5,532,176 A | * | 7/1996 | Katada et al. | 438/229 |
| 6,143,594 A | * | 11/2000 | Tsao et al. | 438/232 |
| 6,221,709 B1 | * | 4/2001 | Sagarwala et al. | 438/231 |
| 6,235,568 B1 | * | 5/2001 | Murthy et al. | 438/231 |

FOREIGN PATENT DOCUMENTS

| JP | 57-012548 | 1/1982 |
|---|---|---|
| JP | 4-170067 | 6/1992 |
| JP | 6-069231 | 3/1994 |
| JP | 8-204021 | 8/1996 |
| JP | 8-321557 | 12/1996 |

OTHER PUBLICATIONS

J. Schmitz, et al., "Ultra–Shallow Junction Formation by Outdiffusion from Implanted Oxide," IEEE, IEDM, 1998, pp. 1009–1012.

* cited by examiner

Primary Examiner—Michael Trinh
(74) Attorney, Agent, or Firm—Oblon, Spivak, McClelland, Maier & Neustadt, P.C.

(57) ABSTRACT

A method of manufacturing a semiconductor device in which an increase in a parasitic resistance can be prevented, resulting in prevention of a deterioration in a current driving capability and a reduction in an operating speed of a semiconductor integrated circuit in consideration of an influence of etching of a semiconductor substrate on an NMOS transistor. By using a gate electrode as an implantation mask, an arsenic or phosphorus ion is implanted into a silicon substrate to form a pair of extension layers in a surface of the silicon substrate. Then, a protective insulating film having a thickness of 1 to 20 nm is formed with a silicon oxide film by a CVD method over the whole surface of the silicon substrate. Thereafter, a boron or $BF_2$ ion is implanted into the silicon substrate from above the protective insulating film by using a gate electrode as an implantation mask. Thus, a pair of extension layers are formed in the surface of the silicon substrate.

9 Claims, 36 Drawing Sheets

F I G . 4 6 (BACKGROUND ART)
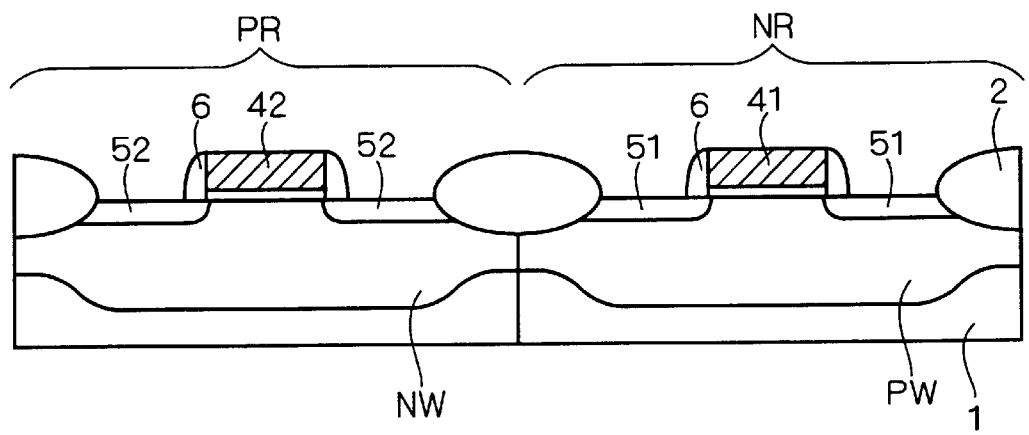
F I G . 4 7 (BACKGROUND ART)
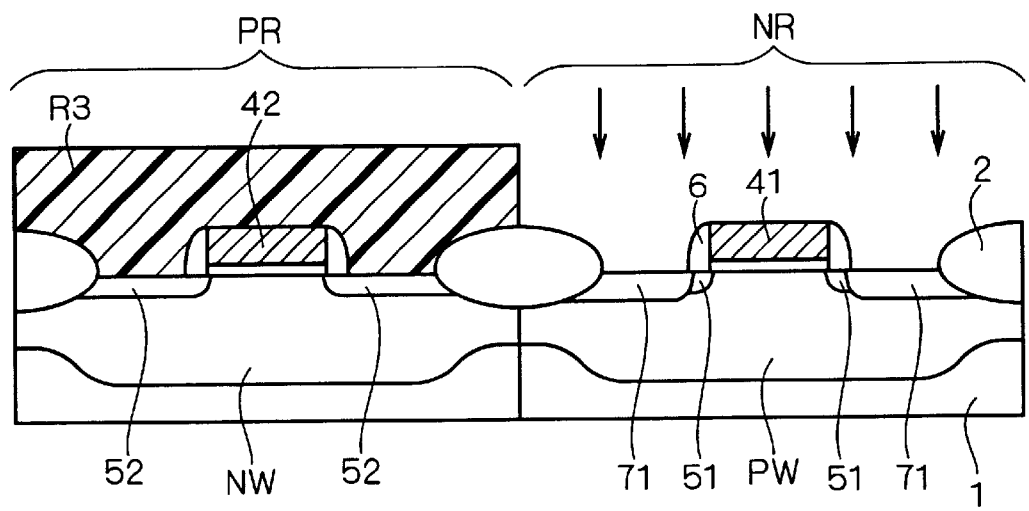

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device which can reduce an etching damage caused by removal of a resist.

2. Description of the Background Art

When a size of an MOSFET (Metal Oxide Silicon Field Effect Transistor) is reduced, a channel resistance is dropped. In order to obtain a transistor having a high driving capability, therefore, a parasitic resistance should be reduced as much as possible. A step of removing a resist to be used for a photolithographic process offers a problem.

While the resist is removed by etching, a semiconductor substrate is also etched slightly. In recent years, an MOSFET having a gate length of approximately 0.1 μm has been developed through a reduction in a size. In such an MOSFET, however, a depth of a source-drain layer is also reduced. Thus, the slight etching of the semiconductor substrate cannot be disregarded.

In particular, an N-channel MOSFET (which will be hereinafter referred to as an NMOS transistor) has a lower channel resistance than that of a P-channel MOSFET (which will be hereinafter referred to as a PMOS transistor). Therefore, when the depth of the source-drain layer is further reduced due to the etching of the semiconductor substrate so that the parasitic resistance is slightly increased, an operating characteristic of the transistor is affected, which is not negligible.

In a conventional art, however, the etching of the semiconductor substrate caused by the removal of the resist has not been particularly recognized as a problem. For example, in a CMOS (Complementary MOS) transistor using a combination of the NMOS transistor and the PMOS transistor, the NMOS transistor and the PMOS transistor are formed adjacently to each other. However, the NMOS transistor has not been considered especially.

A conventional method of manufacturing a CMOS transistor will be described below with reference to FIGS. 42 to 49.

At a step shown in FIG. 42, first of all, an element isolating film 2 is selectively formed in a surface of a silicon substrate 1 to define an NMOS region NR and a PMOS region PR which form an NMOS transistor and a PMOS transistor, respectively. Then, an N well region NW containing an N-type impurity and a P well region PW containing a P-type impurity are formed in the surface of the silicon substrate 1 corresponding to the NMOS region NR and the PMOS region PR, respectively. Thereafter, a gate insulating film 3 is formed on the silicon substrate 1 and a polysilicon film 4 is formed on the gate insulating film 3.

Next, a resist (not shown) is provided on the polysilicon film 4 at a step shown in FIG. 43. The resist is then subjected to patterning by photolithography so that a resist mask is formed. Thereafter, the polysilicon film 4 is subjected to the patterning by using the resist mask. Thus, gate electrodes 41 and 42 are formed on the NMOS region NR and the PMOS region PR, respectively.

At a step shown in FIG. 44, subsequently, a resist mask R1 is formed to cover the PMOS region PR by the photolithography and an N-type impurity ion is implanted into the silicon substrate 1 by using the gate electrode 41 as an implantation mask in the NMOS region NR. Consequently, a pair of extension layers 51 are formed in the surface of the silicon substrate 1. The extension layers 51 are provided opposite to each other to interpose a region of the silicon substrate 1 provided under the gate electrode 41 therebetween. The region of the silicon substrate 1 provided under the gate electrode 41 acts as a channel region.

The extension layer is an impurity introducing layer formed to have a shallower junction than that of a main source-drain layer to be formed later, has the same conductivity type as that of the main source-drain layer, and functions as a source-drain layer. Therefore, the extension layer should be referred to as a source-drain extension layer but it will be referred to as an extension layer for convenience.

After the resist mask R1 is removed, a resist mask R2 is formed to cover the NMOS region NR by the photolithography and a P-type impurity ion is implanted into the silicon substrate 1 by using the gate electrode 42 as an implantation mask in the PMOS region PR so that a pair of extension layers 52 are formed in the surface of the silicon substrate 1 at a step shown in FIG. 45. The extension layers 52 are provided opposite to each other to interpose a region of the silicon substrate 1 provided under the gate electrode 42 therebetween. The region of the silicon substrate 1 provided under the gate electrode 42 acts as a channel region.

After the resist mask R2 is removed, a silicon oxide film (not shown) is formed to cover the whole surface of the silicon substrate 1 and is then removed by anisotropic etching together with the gate insulating film 3 provided over the silicon substrate 1 on the outside of side surfaces of the gate electrodes 41 and 42 such that it remains in only side wall portions of the gate electrodes 41 and 42 at a step shown in FIG. 46. Thus, a side wall protective film (side wall insulating film) 6 is formed.

The side wall protective film 6 is also formed on the gate insulating film 3 provided over the silicon substrate 1 on the outside of the side surfaces of the gate electrodes 41 and 42, and the gate insulating film 3 and the side wall protective film 6 form a two-layered structure. For simplicity, the side wall protective film 6 having a single layer is shown in and after FIG. 46.

At a step shown in FIG. 47, next, a resist mask R3 is formed to cover the PMOS region PR by the photolithography and an N-type impurity ion is implanted into the silicon substrate 1 by using the gate electrode 41 and the side wall protective film 6 as implantation masks in the NMOS region NR. Thus, a pair of source-drain layers 71 are formed in the surface of the silicon substrate 1.

After the resist mask R3 is removed, a resist mask R4 is formed to cover the NMOS region NR by the photolithography and a P-type impurity ion is implanted into the silicon substrate 1 by using the gate electrode 42 and the side wall protective film 6 as implantation masks in the PMOS region PR at a step shown in FIG. 48. Consequently, a pair of source-drain layers 72 are formed in the surface of the silicon substrate 1.

At a step shown in FIG. 49, subsequently, a refractory metal film such as tungsten, cobalt or titanium is formed to cover the whole surface of the silicon substrate 1 and is changed into a silicide by a high temperature treatment. Thus, a silicide film 10 is formed in portions where exposed surfaces of the silicon substrate 1 and the gate electrodes 41 and 42 are provided in contact with the refractory metal film. Then, the refractory metal film which has not been changed into the silicide is removed. Thus, a CMOS transistor 90 shown in FIG. 49 is obtained.

As described above, in the conventional manufacturing method, the extension layer 51 in the NMOS region NR is etched twice at the steps of removing the resist masks R1 and R2 and the gate insulating film 3 cannot prevent the etching of the extension layer 51. At the steps of removing the resist masks R3 and R4, the source-drain layer 71 is subjected to the etching in place of the extension layer 51.

As described above, the extension layer is formed more shallowly than the main source-drain layer. Therefore, the extension layer is affected more remarkably by the etching of the silicon substrate 1 than the main source-drain layer. In addition, the NMOS transistor has a lower channel resistance and is more affected by an increase in a resistance of a diffusion layer to be the parasitic resistance than the PMOS transistor due to a difference in a mobility of a carrier to be used.

In the conventional method of manufacturing a semiconductor device, thus, the influence of the etching of the semiconductor substrate on the NMOS transistor has not been considered. Therefore, there has been a problem in that a current driving capability is deteriorated with an increase in a parasitic resistance, and furthermore, an operating speed of a semiconductor integrated circuit is reduced.

SUMMARY OF THE INVENTION

A first aspect of the present invention is directed to a method of manufacturing a semiconductor device comprising the steps of (a) defining a first NMOS region and a first PMOS region for forming at least a first NMOS transistor and a first PMOS transistor in a surface of a semiconductor substrate, (b) forming a first gate insulating film on at least the first NMOS region and the first PMOS region, (c) forming first and second gate electrodes on the first gate insulating film provided over the first NMOS region and the first PMOS region, (d) covering the first PMOS region with a first resist mask and implanting an N-type impurity ion by using the first gate electrode as an implantation mask, thereby forming a pair of N-type extension layers in the surface of the semiconductor substrate on an outside of a side surface of the first gate electrode, (e) removing the first resist mask and then forming a protective insulating film over a whole surface of the semiconductor substrate, and (f) covering the first NMOS region with a second resist mask and implanting a P-type impurity ion from above the protective insulating film by using the second gate electrode as an implantation mask, thereby forming a pair of P-type extension layers in the surface of the semiconductor substrate on an outside of a side surface of the second gate electrode.

A second aspect of the present invention is directed to the method of manufacturing a semiconductor device, wherein the step (d) includes the step of forming the N-type extension layers to have a smaller depth than 0.1 $\mu$m, to have a maximum impurity concentration in the vicinity of the surface of the semiconductor substrate and to have the maximum impurity concentration set to $1 \times 10^{19}/cm^3$ to $1 \times 10^{21}/cm^3$.

A third aspect of the present invention is directed to a method of manufacturing a semiconductor device comprising the steps of (a) defining a first NMOS region and a first PMOS region for forming at least a first NMOS transistor and a first PMOS transistor in a surface of a semiconductor substrate, (b) forming a first gate insulating film on at least the first NMOS region and the first PMOS region, (c) forming first and second gate electrodes on the first gate insulating film provided over the first NMOS region and the first PMOS region, (d) covering the first NMOS region with a first resist mask and implanting a P-type impurity ion by using the second gate electrode as an implantation mask, thereby forming a pair of P-type extension layers in the surface of the semiconductor substrate on an outside of a side surface of the second gate electrode, and (e) removing the first resist mask and then covering the PMOS region with a second resist mask and implanting an N-type impurity ion by using the first gate electrode as an implantation mask, thereby forming a pair of N-type extension layers in the surface of the semiconductor substrate on an outside of a side surface of the first gate electrode, the step (e) including the step of forming the N-type extension layers to have a smaller depth than 0.1 $\mu$m, to have a maximum impurity concentration in the vicinity of the surface of the semiconductor substrate and to have the maximum impurity concentration set to $1 \times 10^{19}/cm^3$ to $1 \times 10^{21}/cm^3$.

A fourth aspect of the present invention is directed to the method of manufacturing a semiconductor device, wherein the step (a) includes the step of defining a second NMOS region for forming a second NMOS transistor having a higher operating voltage than that of the first NMOS transistor and a second PMOS region for forming a second PMOS transistor having a higher operating voltage than that of the first PMOS transistor, and the step (b) includes the step of forming a second gate insulating film having a greater thickness than that of the first gate insulating film over the second NMOS region and the second PMOS region, the method further comprising the step of forming a pair of N-type impurity layers of the second NMOS transistor and a pair of P-type impurity layers of the second PMOS transistor in surfaces of the second NMOS region and the second PMOS region between the steps (b) and (c).

A fifth aspect of the present invention is directed to the method of manufacturing a semiconductor device, wherein the step (e) includes the step of forming the protective insulating film in a thickness of 1 nm to 20 nm.

A sixth aspect of the present invention is directed to the method of manufacturing a semiconductor device, wherein the step (e) includes the step of forming the protective insulating film as a silicon oxide film by a CVD method.

A seventh aspect of the present invention is directed to the method of manufacturing a semiconductor device, wherein the step (e) includes the step of forming the protective insulating film as a silicon oxide film by a thermal oxidizing method.

An eighth aspect of the present invention is directed to the method of manufacturing a semiconductor device, wherein the step (e) includes the step of forming the protective insulating film as a silicon nitride film by a CVD method.

A ninth aspect of the present invention is directed to the method of manufacturing a semiconductor device, wherein the step (e) includes the step of forming the protective insulating film as a silicon nitride film by a thermal nitriding method.

According to the first aspect of the present invention, a pair of N-type extension layers are formed in the first NMOS region, the protective insulating film is then formed over the whole surface of the semiconductor substrate, and a pair of P-type extension layers are thereafter formed in the first PMOS region. Therefore, the N-type extension layer is subjected to the etching when the first resist mask is to be removed, and is then protected by the protective insulating film. Therefore, an etching amount is reduced. As a result, a junction depth of the N-type extension layer is reduced. Consequently, it is possible to obtain a semiconductor device in which a resistance value, that is, a parasitic resistance value can be prevented from being increased, a current driving capability can be prevented from being deteriorated and an operating speed can be prevented from being reduced. Moreover, arsenic or phosphorus to be the N-type impurity has a smaller diffusion coefficient than that of boron to be the P-type impurity. Therefore, in the case in which the N-type extension layer is to be formed after the formation of the P-type extension layer, the P-type extension layer is affected. Therefore, a heat treatment for activating the N-type extension layer is not fully carried out. In the present invention, however, the P-type extension layer is formed after the formation of the N-type extension layer. Consequently, the heat treatment for activating the N-type extension layer can be carried out sufficiently. Thus, it is possible to reliably recover the damage of the substrate caused by the ion implantation and carry out the diffusion of the impurity.

According to the second aspect of the present invention, the depths of the N-type and P-type extension layers are smaller than 0.1 µm, and the maximum impurity concentration is obtained in the vicinity of the surface of the semiconductor substrate and is set to $1 \times 10^{19}/cm^3$ to $1 \times 10^{21}/cm^3$. Consequently, it is possible to obtain an extension layer which has a small resistance value and is effective in suppressing a short channel effect.

According to the third aspect of the present invention, a pair of N-type extension layers are formed after a pair of P-type extension layers are formed. Therefore, the N-type extension layer is not subjected to the etching when the first resist mask is to be removed. Consequently, an etching amount is reduced. As a result, a junction depth of the N-type extension layer is reduced. Thus, it is possible to obtain a semiconductor device in which a resistance value, that is, a parasitic resistance value can be prevented from being increased, a current driving capability can be prevented from being deteriorated and an operating speed can be prevented from being reduced. Moreover, the depths of the N-type extension layers are smaller than 0.1 µm, and the maximum impurity concentration is obtained in the vicinity of the surface of the semiconductor substrate and is set to $1 \times 10^{19}/cm^3$ to $1 \times 10^{21}/cm^3$. Consequently, it is possible to obtain an extension layer which has a small resistance value and is effective in suppressing a short channel effect.

According to the fourth aspect of the present invention, the method of manufacturing a semiconductor device further comprises the step of forming a pair of N-type impurity layers and a pair of P-type impurity layers in the surfaces of the second NMOS region for forming the second NMOS transistor and the second PMOS region for forming the second PMOS transistor when further forming the second NMOS transistor and the second PMOS transistor which have high operating voltages. Therefore, a frequency at which the semiconductor substrate is subjected to the etching is increased. However, the N-type extension layer included in the first NMOS transistor is subjected to the etching only when the first resist mask is to be removed. Consequently, an etching amount is reduced. As a result, in a semiconductor device comprising CMOS transistors having different supply voltages, for example, a junction depth of the N-type extension layer in the first NMOS transistor having a low voltage is reduced. Thus, it is possible to obtain a semiconductor device in which a resistance value, that is, a parasitic resistance value can be prevented from being increased, a current driving capability can be prevented from being deteriorated and an operating speed can be prevented from being reduced.

According to the fifth aspect of the present invention, the protective insulating film is formed in a thickness of 1 nm to 20 nm. Therefore, also in the case in which the protective insulating film partially remains, the influence on a device characteristic can be relieved.

According to the sixth aspect of the present invention, the protective insulating film is formed as the silicon oxide film by the CVD method. Therefore, it is possible to obtain a protective insulating film having a great step coverage.

According to the seventh aspect of the present invention, the protective insulating film is formed as the silicon oxide film by the thermal oxidizing method. Therefore, it is possible to easily control a film thickness and to reduce a variation in a device characteristic which is caused by a variation in the film thickness.

According to the eighth aspect of the present invention, the protective insulating film is formed as the silicon nitride film by the CVD method. Therefore, it is possible to obtain a protective insulating film having a great step coverage. In addition, the silicon nitride film is etched by aqueous ammonia peroxide with difficulty. Therefore, the thickness can be more reduced than that in the case in which the silicon oxide film is used and the influence on a device characteristic can be relieved.

According to the ninth aspect of the present invention, the protective insulating film is formed as the silicon nitride film by the thermal nitriding method. Therefore, it is possible to easily control a film thickness and to reduce a variation in a device characteristic which is caused by a variation in the film thickness.

In order to solve the above-mentioned problems, it is an object of the present invention to provide a method of manufacturing a semiconductor device which can prevent an increase in a parasitic resistance to inhibit a current driving capability from being deteriorated and an operating speed of a semiconductor integrated circuit from being reduced in consideration of the influence of etching of a semiconductor substrate on an NMOS transistor.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Embodiment>

As the simplest method of manufacturing a CMOS transistor for preventing an extension layer in an NMOS region from being shallow, it is preferable that the extension layer in the NMOS region should be formed after formation in a PMOS region.

More specifically, in order to form an extension layer and a main source-drain layer in the CMOS transistor, a photolithographic process for forming a resist mask should be carried out at least twice in each of the NMOS region and the PMOS region. However, when the formation of the extension layer in the PMOS region is carried out earlier than that in the NMOS region, the number of times at which the extension layer in the NMOS region is subjected to etching can be reduced so that the extension layer can be prevented from being shallow.

<A-1. Manufacturing Method>

As a first embodiment of the present invention, a method of manufacturing a CMOS transistor 100 will be described below with reference to FIGS. 1 to 10. A structure of the CMOS transistor 100 is shown in FIG. 10 illustrating a final step.

Figure 1:
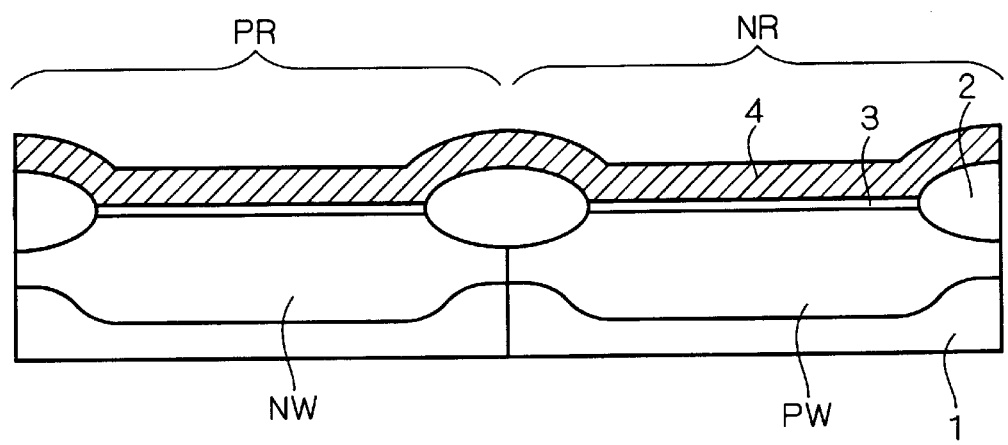
FIGS. 1 to 10 are sectional views showing a process for manufacturing a semiconductor device according to a first embodiment of the present invention.

At a step shown in FIG. 1, first of all, an element isolating film 2 is selectively formed in a surface of a silicon substrate 1 to define an NMOS region NR and a PMOS region PR where an NMOS transistor and a PMOS transistor are to be formed. Then, an N well region NW containing an N-type impurity and a P well region PW containing a P-type impurity are formed in the surface of the silicon substrate 1 corresponding to the NMOS region NR and the PMOS region PR.

Furthermore, a gate insulating film 3 is formed by a silicon oxide film, a silicon nitride film, a metal oxide film or a multiplayered film constituted by a combination thereof over the whole surface of the silicon substrate 1. A thickness of the gate insulating film 3 is set to be approximately 1 nm to 20 nm through a conversion with a dielectric constant of the silicon oxide film (which will be hereinafter referred to as a converted thickness).

Then, a polysilicon film 4 having a thickness of 50 to 300 nm is formed by a CVD method over a whole upper surface of the gate insulating film 3. The polysilicon film 4 may be a doped polysilicon film having an impurity such as phosphorus (P) or boron (B) or a non-doped polysilicon film. The doped polysilicon film may be formed by introducing an impurity during deposition using the CVD method or by introducing an impurity through ion implantation after the non-doped polysilicon film is formed. Moreover, the impurity may be fluorine (F), nitrogen (N) and the like in addition to phosphorus and boron.

Moreover, an amorphous silicon film may be formed in place of the polysilicon film.

Figure 2:
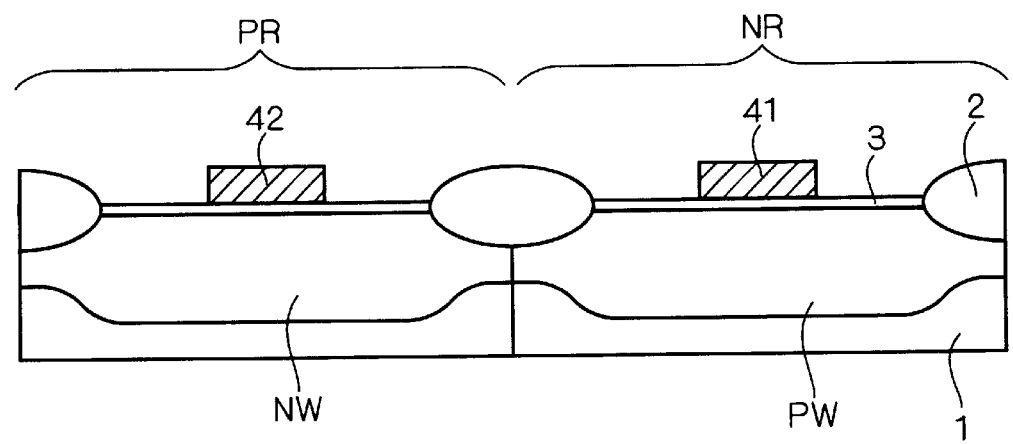

Next, a resist (not shown) is provided over a whole surface of the polysilicon film 4 at a step shown in FIG. 2, and is then subjected to patterning by photolithography, thereby forming a resist mask. Then, the polysilicon film 4 is subjected to the patterning by using the resist mask. Consequently, gate electrodes 41 and 42 are formed on the NMOS region NR and the PMOS region PR, respectively.

Figure 3:
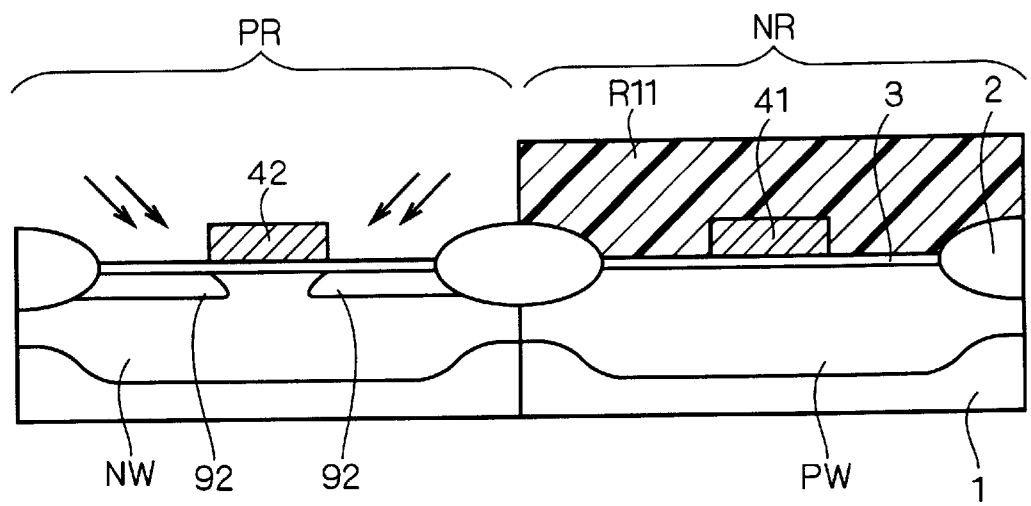

Subsequently, a resist mask R11 is formed to cover the NMOS region NR by the photolithography at a step shown in FIG. 3. Then, the silicon substrate 1 is inclined at a maximum angle of approximately 60°, and an N-type impurity ion such as arsenic (As) or phosphorus is implanted into the silicon substrate 1 in the PMOS region PR, thereby forming a pocket layer 92. For the conditions of implantation, an implantation energy is set to 1 keV to 50 keV and a dose amount is set to $1\times10^{13}$ to $1\times10^{14}/cm^2$.

When the implantation in a predetermined direction is ended, the silicon substrate 1 is rotated at a predetermined angle in the surface and the implantation is then carried out again. Thus, the silicon substrate 1 is rotated intermittently so that the N-type impurity can be implanted in an oblique direction into the silicon substrate 1 on the outside of a side surface of the gate electrode 42.

The pocket layer 92 is formed to be extended in an oblique direction to a main surface of the silicon substrate 1 and has a tip portion extended to a region provided under the gate electrode 42. It is desirable that the pocket layer 92 should enter the region provided under the gate electrode 42 as much as possible. An inclination of the silicon substrate 1 is determined by a layout of a semiconductor device. In some cases, the implantation should be carried out at a comparatively great angle as shown in FIG. 3 so that the pocket layer 92 cannot considerably enter the region provided under the gate electrode 42.

The pocket layer 92 contains an impurity of a reverse conductivity type to that of a source-drain layer, and is provided to suppress expansion in a horizontal direction of a depletion layer from a drain layer, thereby preventing a punch through. The pocket layer 92 locally increases an impurity concentration under the gate electrode 42. Therefore, a threshold voltage is not raised.

Figure 4:
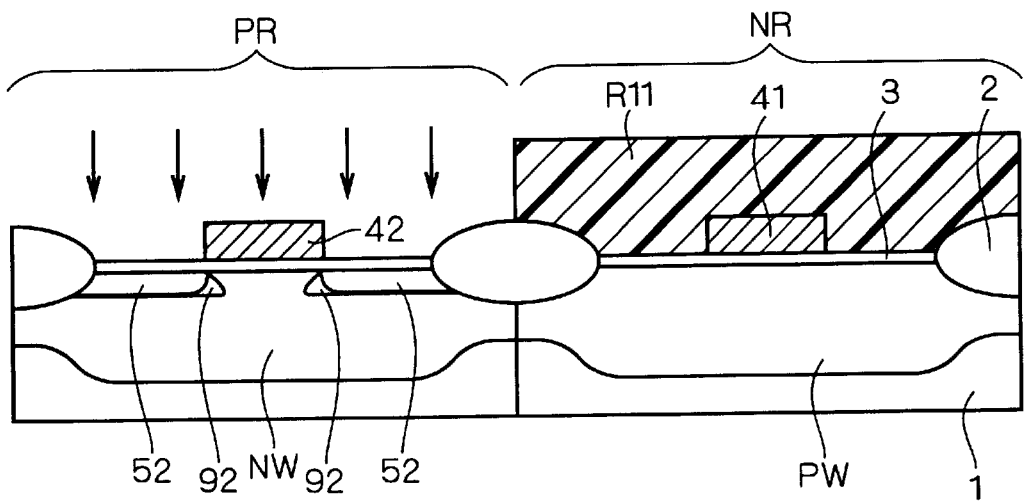

At a step shown in FIG. 4, next, the inclination of the silicon substrate 1 is restored and a boron or $BF_2$ ion is implanted into the silicon substrate 1 by using the gate electrode 42 as an implantation mask to form a pair of extension layers 52 in the surface of the silicon substrate 1. For the conditions of implantation, an implantation energy is set to 1 keV to 50 keV and a dose amount is set to $1\times10^{13}$ to $4\times10^{15}/cm^2$.

The extension layers 52 are provided opposite to each other by interposing a region of the silicon substrate 1 provided under the gate electrode 42 therebetween. The region of the silicon substrate 1 which is provided under the gate electrode 42 acts as a channel region.

The extension layer is an implantation introducing layer which is formed to have a shallower junction than that of a main source-drain layer which will be formed later, and has the same conductivity type as that of the main source-drain layer and functions as a source-drain layer. Therefore, although the extension layer should be referred to as a source-drain extension layer, it will be referred to as an extension layer for convenience.

By the formation of the extension layer 52, most of the pocket layer 92 is covered with the extension layer 52. However, the pocket layer 92 remains in the channel region on the tip portion of the extension layer 52.

Figure 5:
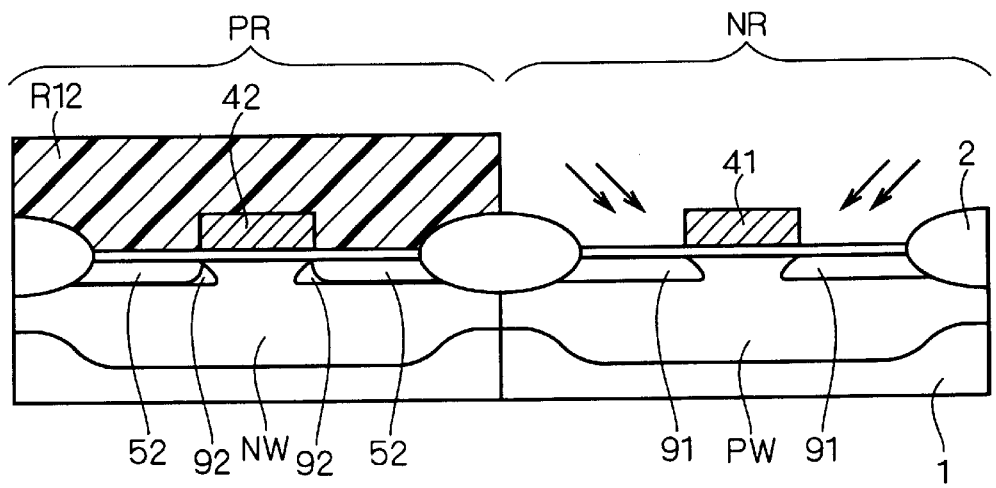

Next, the resist mask R11 is removed and a resist mask R12 is then formed to cover the PMOS region PR by the photolithography at a step shown in FIG. 5. Thereafter, the silicon substrate 1 is inclined at a maximum angle of approximately 60°, and a P-type impurity ion such as boron is implanted into the silicon substrate 1 in the NMOS region NR, thereby forming a pocket layer 91. For the conditions of implantation, an implantation energy is set to 1 keV to 50 keV and a dose amount is set to $1\times10^{13}$ to $1\times10^{4}/cm^2$.

The pocket layer 91 is formed to be extended in an oblique direction to a main surface of the silicon substrate 1 and has a tip portion extended to a region provided under the gate electrode 41.

The pocket layer 91 contains an impurity of a reverse conductivity type to that of the source-drain layer and is provided to prevent a punch through in the same manner as the pocket layer 92.

Figure 6:
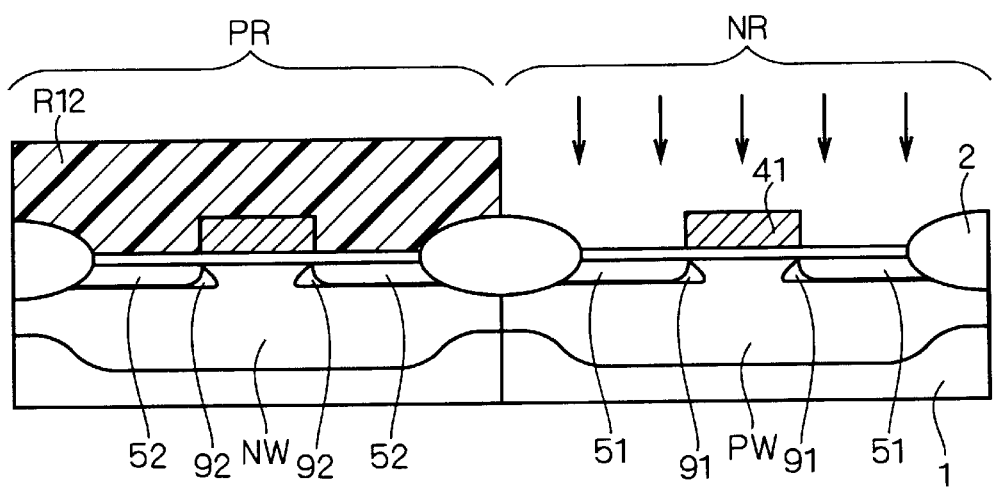

At a step shown in FIG. 6, next, the inclination of the silicon substrate 1 is restored and an arsenic or phosphorus ion is implanted into the silicon substrate 1 by using the gate electrode 41 as an implantation mask to form a pair of extension layers 51 in the surface of the silicon substrate 1. For the conditions of implantation, an implantation energy is set to 1 keV to 50 keV and a dose amount is set to $1 \times 10^{13}$ to $4 \times 10^{15}/cm^2$.

The extension layers 51 are provided opposite to each other by interposing a region of the silicon substrate 1 provided under the gate electrode 41 therebetween. The region of the silicon substrate 1 which is provided under the gate electrode 41 acts as a channel region.

By the formation of the extension layer 51, most of the pocket layer 91 is covered with the extension layer 51. However, the pocket layer 91 remains in the channel region on the tip portion of the extension layer 51.

Figure 7:
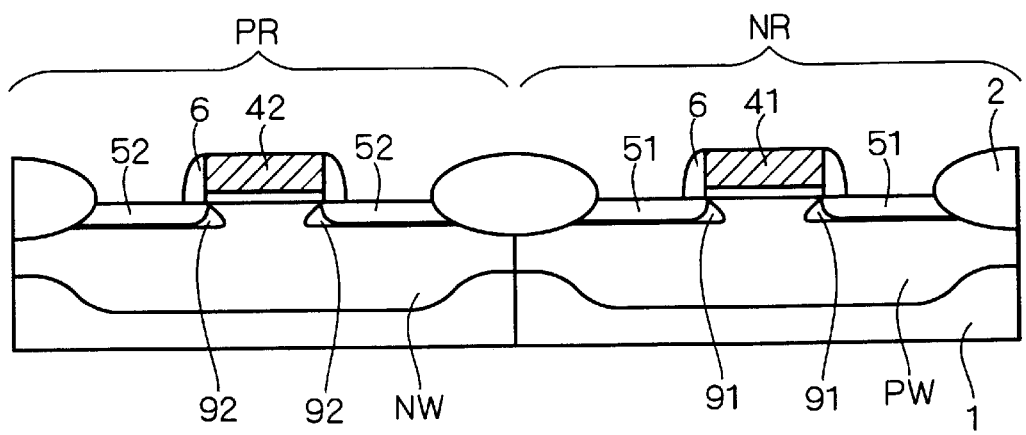

After the resist mask R12 is removed, a silicon oxide film (not shown) having a thickness of 10 to 200 nm is formed by a CVD method to cover the whole surface of the silicon substrate 1 and is removed by anisotropic etching together with the gate insulating film 3 provided over the silicon substrate 1 on the outside of side surfaces of the gate electrodes 41 and 42 such that it remains in only side wall portions of the gate electrodes 41 and 42 at a step shown in FIG. 7. Thus, a side wall protective film (side wall insulating film) 6 is formed. The side wall protective film is not restricted to the silicon oxide film but may be a silicon nitride film or a layered film of the silicon oxide film and the silicon nitride film.

Moreover, the side wall protective film 6 is also formed on the gate insulating film 3 provided over the silicon substrate 1 on the outside of the side surfaces of the gate electrodes 41 and 42, and the gate insulating film 3 and the side wall protective film 6 constitute a two-layered structure. For simplicity, the side wall protective film 6 having a single layer is shown in and after FIG. 7.

Figure 8:
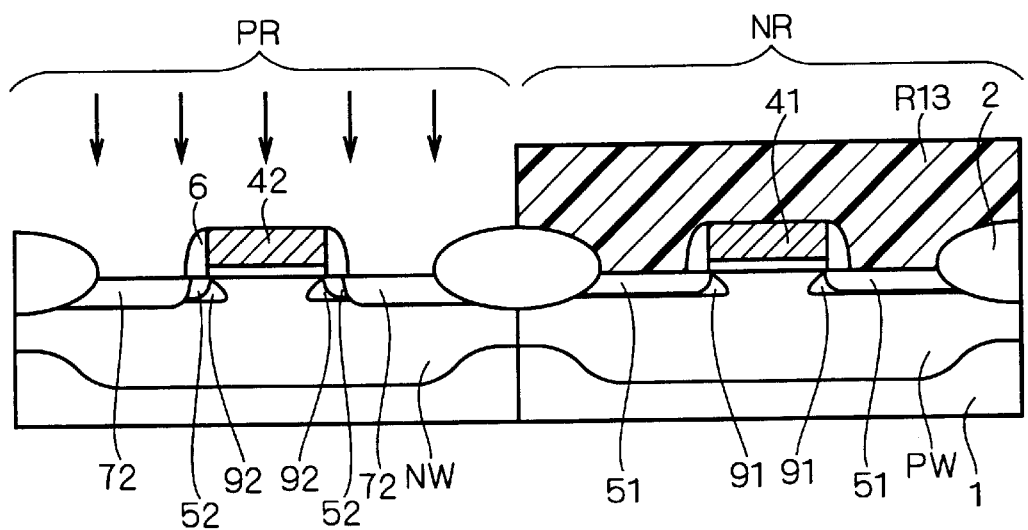

At a step shown in FIG. 8, next, a resist mask R13 is formed to cover the NMOS region NR by the photolithography, and a P-type impurity ion such as boron or $BF_2$ is implanted into the silicon substrate 1 by using the gate electrode 42 and the side wall protective film 6 as implantation masks in the PMOS region PR. Thus, a pair of main source-drain layers 72 are formed in the surface of the silicon substrate 1. For the conditions of implantation, an implantation energy is set to 10 keV to 100 keV and a dose amount is set to $1 \times 10^{14}$ to $1 \times 10^{16}/cm^2$.

Figure 9:
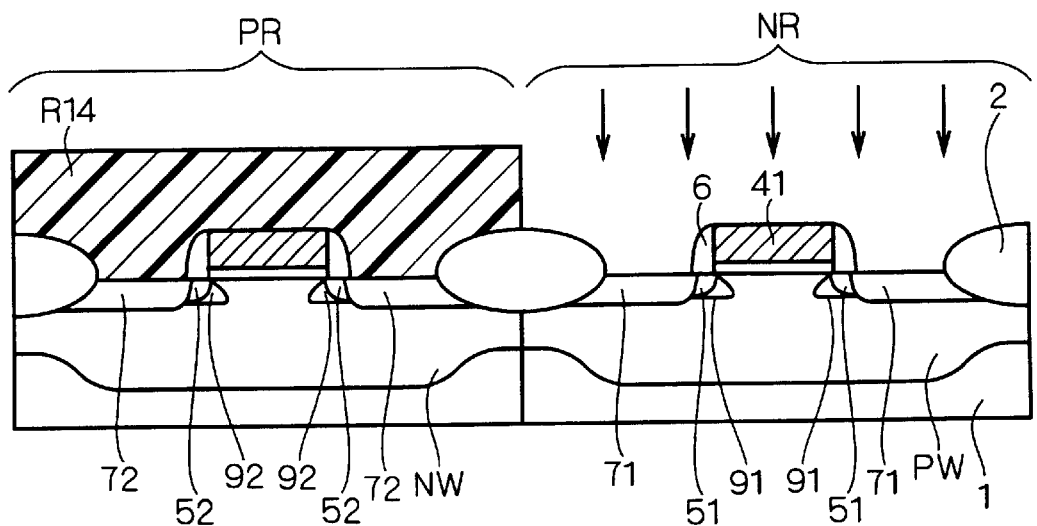
Figure 10:
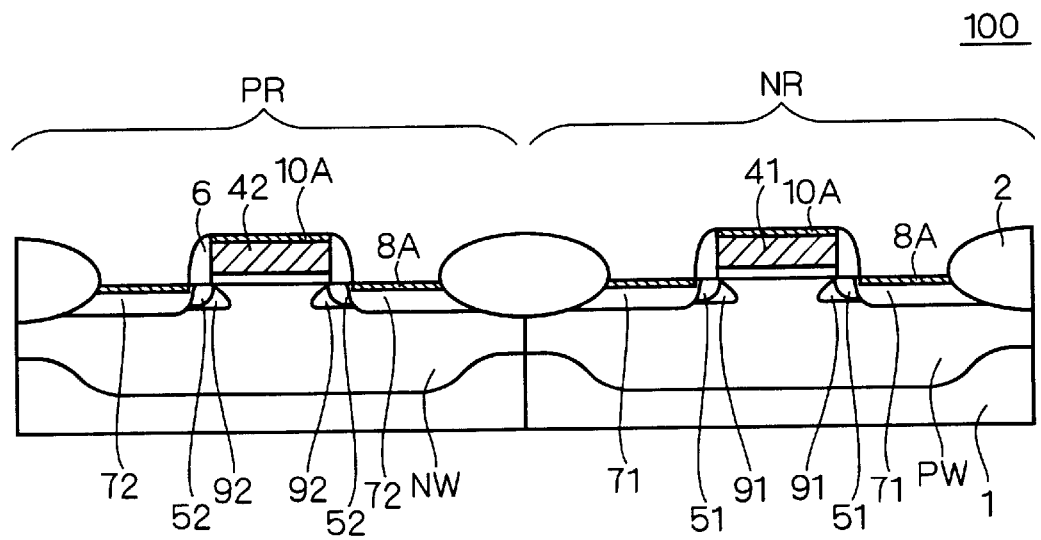

After the resist mask R13 is removed, a resist mask R14 is formed to cover the PMOS region PR by the photolithography, an N-type impurity ion such as arsenic is implanted into the silicon substrate 1 by using the gate electrode 41 and the side wall protective film 6 as implantation masks in the NMOS region NR, and a pair of main source-drain layers 71 are thus formed in the surface of the silicon substrate 1 at a step shown in FIG. 9. For the conditions of implantation, an implantation energy is set to 10 keV to 100 keV and a dose amount is set to $1 \times 10^{14}$ to $1 \times 10^{16}/cm^2$.

Then, a heat treatment is carried out for 1 second to 360 minutes at a temperature of 800 to 1100° C. Thus, the main source-drain layers 71 and 72 are activated.

The main source-drain layers 71 and 72 are formed to have greater junction depths than those of the extension layers 51 and 52.

At a step shown in FIG. 10, next, a refractory metal film having a thickness of 1 to 16 nm, for example, a cobalt film (not shown) is formed to cover the whole surface of the silicon substrate 1, and is changed into a silicide by a high temperature treatment. Consequently, cobalt silicide films 8A and 10A are formed in contact portions of exposed surfaces of the silicon substrate 1 and the gate electrodes 41 and 42 with the cobalt film. Then, the cobalt film which has not been changed into the silicide is removed. Thus, the CMOS transistor 100 is obtained.

<A-2. Function and Effect>

As described above, a photolithographic process is carried out twice for forming a resist mask in each of the NMOS region and the PMOS region in order to provide the extension layer and the main source-drain layers in the CMOS transistor.

In the removal of the resist mask, aqueous ammonia peroxide (a mixed solution of ammonia, aqueous hydrogen peroxide and water) is used as an etching solution. Therefore, the silicon substrate 1 is slightly etched. The extension layer 51 in the NMOS region NR is simply subjected to the etching when the resist mask R12 in the PMOS region PR is to be removed at the step shown in FIG. 7 after the extension layer 51 is formed at the step shown in FIG. 6 and before the side wall protective film 6 is formed. Accordingly, an etching amount is more reduced as compared with the conventional manufacturing method in which the extension layer 51 is subjected to the etching twice before the side wall protective film 6 is formed.

As a result, the junction depth of the extension layer 51 finally remaining in the CMOS transistor 100 is reduced so that a resistance value, that is, a parasitic resistance value can be prevented from being increased and a current driving capability can be prevented from being deteriorated. Thus, it is possible to prevent an operating speed of a semiconductor integrated circuit from being reduced.

The extension layer 52 in the PMOS region PR is subjected to the etching twice by the removal of the resist masks R11 and R12. The P-type impurity has a larger diffusion amount than that of the N-type impurity and the extension layer 52 to be a P-type impurity diffusion layer is formed more deeply than the extension layer 51 to be an N-type impurity diffusion layer. Accordingly, even if an amount for removal through the etching is larger than that of the extension layer 52, a resistance of the extension layer 51 is not higher than that of the extension layer 52. In other words, the extension layer 52 has a higher degree of margin for the etching.

While the junction depths of the extension layers 51 and 52 are varied depending on an integration rate of the semiconductor device defined by a design rule, a gate length and the like, it is assumed that the present invention is applied to a semiconductor device having a junction depth of an extension layer of 0.1 μm or less and a maximum impurity concentration of $1 \times 10^{19}$ to $1 \times 10^{21}/cm^3$.

Figure 11:
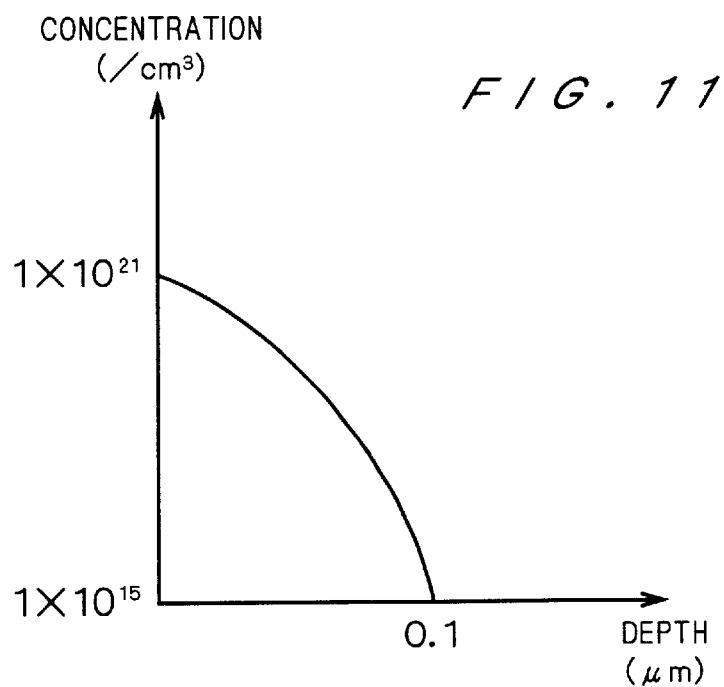
FIG. 11 is a chart showing an impurity concentration distribution of an extension layer.

FIG. 11 shows an impurity concentration distribution in the extension layers 51 and 52. In FIG. 11, an axis of abscissa indicates a depth from a substrate surface and an axis of ordinate indicates an impurity concentration. In this example, a maximum impurity concentration of $1 \times 10^{21}/cm^3$ is obtained in the vicinity of the substrate surface and an impurity concentration of $1 \times 10^{15}/cm^3$ is obtained in a position having a depth of 0.1 μm.

In the extension layers 51 and 52 shown in FIG. 11, a maximum impurity concentration is obtained in the vicinity of the substrate surface and a concentration is more reduced if a depth in the substrate is increased. By using an extension layer having such a structure, a resistance value can be reduced, and furthermore, a short channel effect can be suppressed effectively.

As described above, the NMOS transistor has a lower channel resistance than that of the PMOS transistor and is more affected by an increase in a resistance of the diffusion layer to be a parasitic resistance than the PMOS transistor due to a variation in a mobility of a carrier to be used. Therefore, preferential prevention of an increase in a resistance value of the extension layer 51 is more effective in that the operating speed of the semiconductor integrated circuit can be prevented from being reduced.

The main source-drain layer 71 in the NMOS region NR is subjected to the etching for removing the resist mask R14 and the main source-drain layer 72 in the PMOS region PR is subjected to the etching for removing the resist masks R13 and R14. The cobalt silicide film 8A is formed on the surfaces of the main source-drain layers 71 and 72 so that a small resistance value can be maintained as described with reference to FIG. 10. Therefore, a reduction in a junction depth through the etching has an influence reduced.

<B. Second Embodiment>

In the first embodiment of the present invention, there has been described the method in which the extension layer 51 in the NMOS region is formed after the formation of the extension layer 52 in the PMOS region to reduce the number of times at which the extension layer 51 in the NMOS region is subjected to the etching, thereby preventing the extension layer from becoming shallower. In the following second embodiment of the present invention, description will be given to a method of covering an extension layer with a protective insulating film to prevent the extension layer from being etched.

<B-1. Manufacturing Method>

Figure 18:
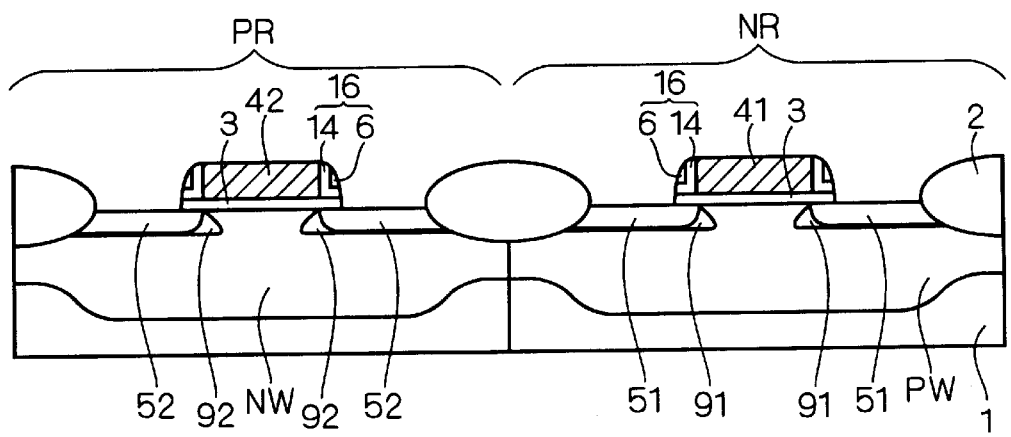
Figure 19:
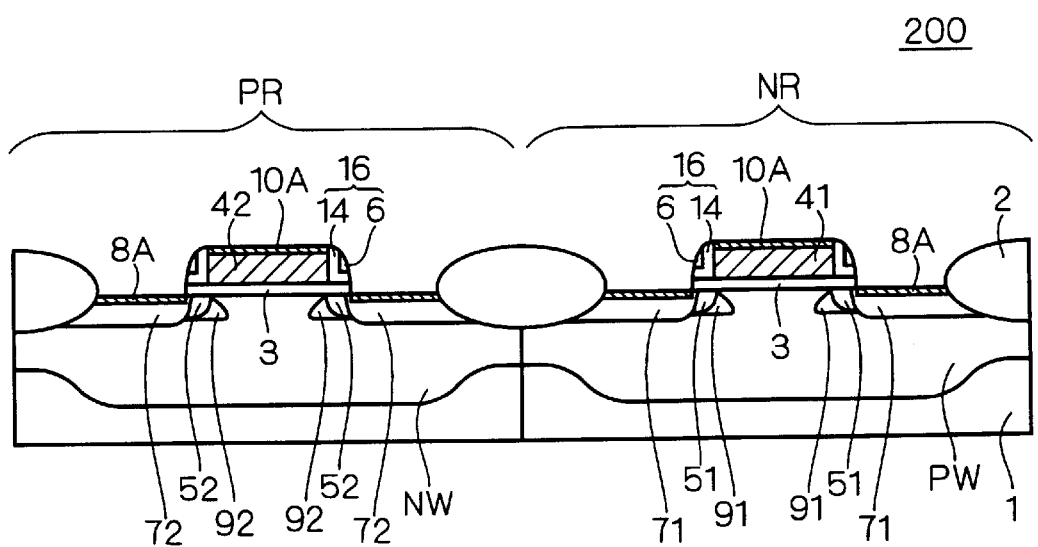

As the second embodiment of the present invention, a method of manufacturing a CMOS transistor 200 will be described below with reference to FIGS. 12 to 19. A structure of the CMOS transistor 200 is shown in FIG. 19 illustrating a final step. The same structures as those in the first embodiment have the same reference numerals and repetitive description will be omitted.

Through the steps described with reference to FIGS. 1 and 2, first of all, gate electrodes 41 and 42 are subjected to patterning on an NMOS region NR and a PMOS region PR.

Figure 12:
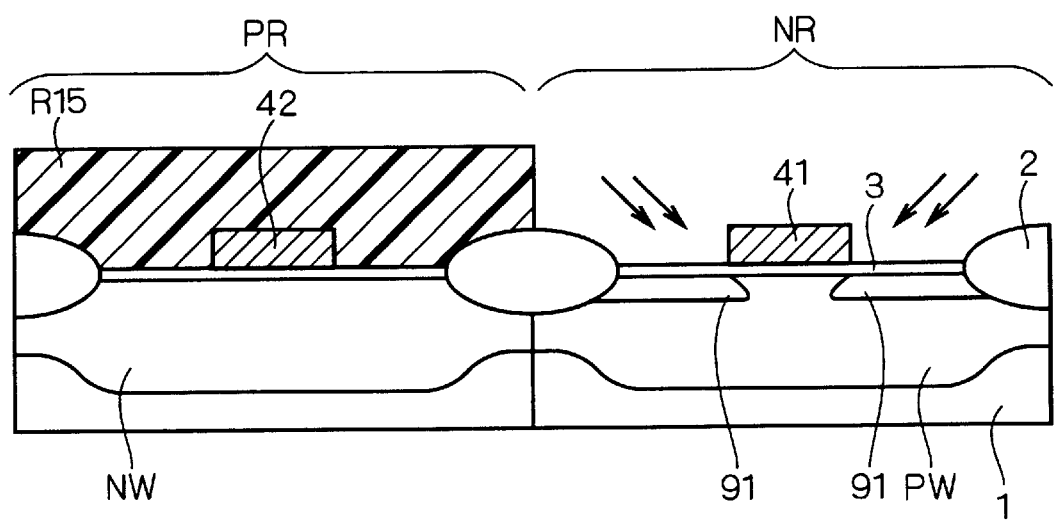
FIGS. 12 to 19 are sectional views showing a process for manufacturing a semiconductor device according to a second embodiment of the present invention.

Next, a resist mask R15 is formed to cover the PMOS region PR by photolithography at a step shown in FIG. 12. Then, a silicon substrate 1 is inclined at a maximum angle of approximately 60°, and a P-type impurity ion such as boron is implanted into the silicon substrate 1 in the NMOS region NR, thereby forming a pocket layer 91. For the conditions of implantation, an implantation energy is set to 1 keV to 50 keV and a dose amount is set to $1\times10^{13}$ to $1\times10^{14}/cm^2$.

The pocket layer 91 is formed to be extended in an oblique direction to a main surface of the silicon substrate 1 and has a tip portion extended to a region provided under the gate electrode 41.

Figure 13:
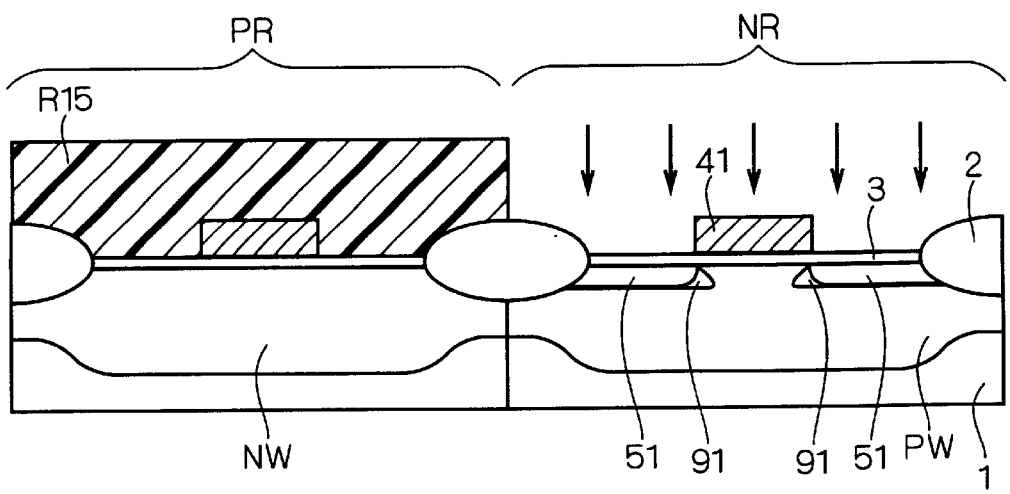

At a step shown in FIG. 13, next, the inclination of the silicon substrate 1 is restored and an arsenic or phosphorus ion is implanted into the silicon substrate 1 by using the gate electrode 41 as an implantation mask to form a pair of extension layers 51 in the surface of the silicon substrate 1. For the conditions of implantation, an implantation energy is set to 1 keV to 50 keV and a dose amount is set to $1\times10^{13}$ to $4\times10^{15}/cm^2$.

Figure 14:
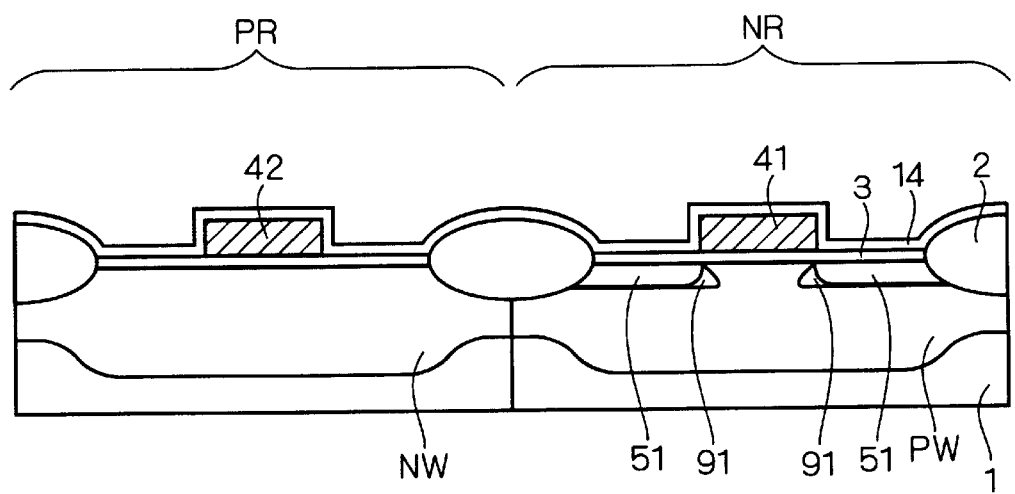

Next, the resist mask R15 is removed and a protective insulating film 14 having a thickness of 1 to 20 nm is then formed of a silicon oxide film by a CVD method over the whole surface of the silicon substrate 1 at a step shown in FIG. 14. The silicon oxide film formed by the CVD method acts as the protective insulating film 14 having a great step coverage.

Figure 15:
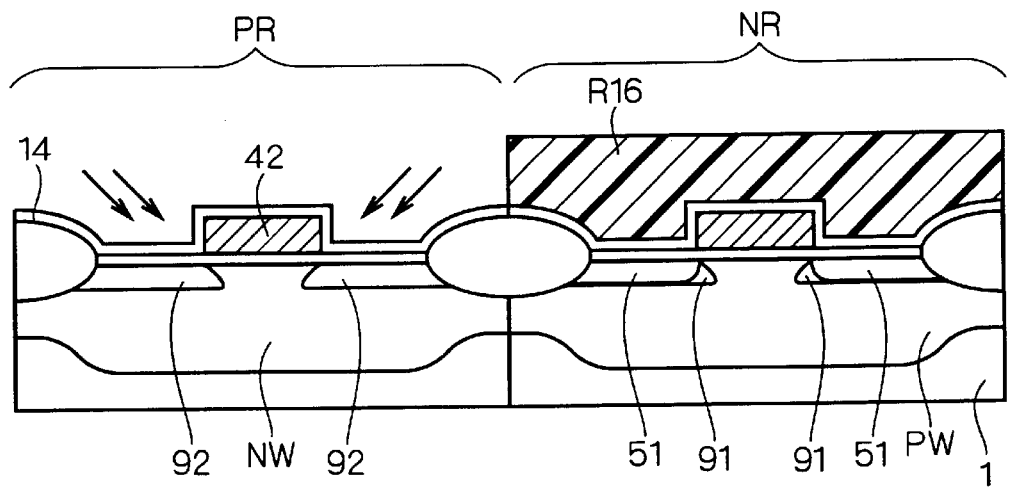

Next, a resist mask R16 is formed to cover the NMOS region NR by photolithography at a step shown in FIG. 15.

Then, the silicon substrate 1 is inclined at a maximum angle of approximately 60°, and an N-type impurity ion such as arsenic (As) or phosphorus is implanted into the silicon substrate 1 in the PMOS region PR, thereby forming a pocket layer 92. For the conditions of implantation, an implantation energy is set to 1 keV to 50 keV and a dose amount is set to $1\times10^{13}$ to $1\times10^{14}/cm^2$. The pocket layer 92 is formed to be extended in an oblique direction to a main surface of the silicon substrate 1 and has a tip portion extended to a region provided under the gate electrode 42.

Figure 16:
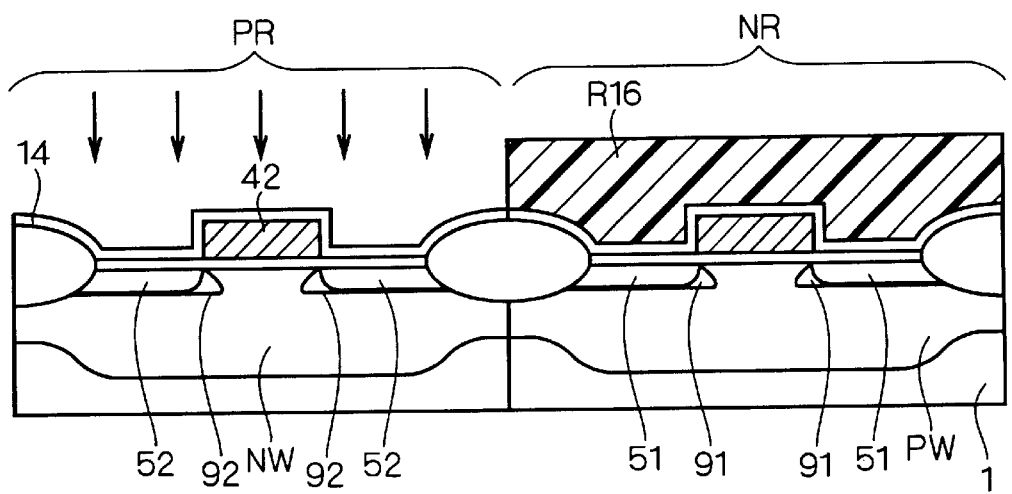

At a step shown in FIG. 16, next, the inclination of the silicon substrate 1 is restored and a boron or $BF_2$ ion is implanted into the silicon substrate 1 by using the gate electrode 42 as an implantation mask to form a pair of extension layers 52 in the surface of the silicon substrate 1. For the conditions of implantation, an implantation energy is set to 1 keV to 50 keV and a dose amount is set to $1\times10^{13}$ to $4\times10^{15}/cm^2$.

Figure 17:
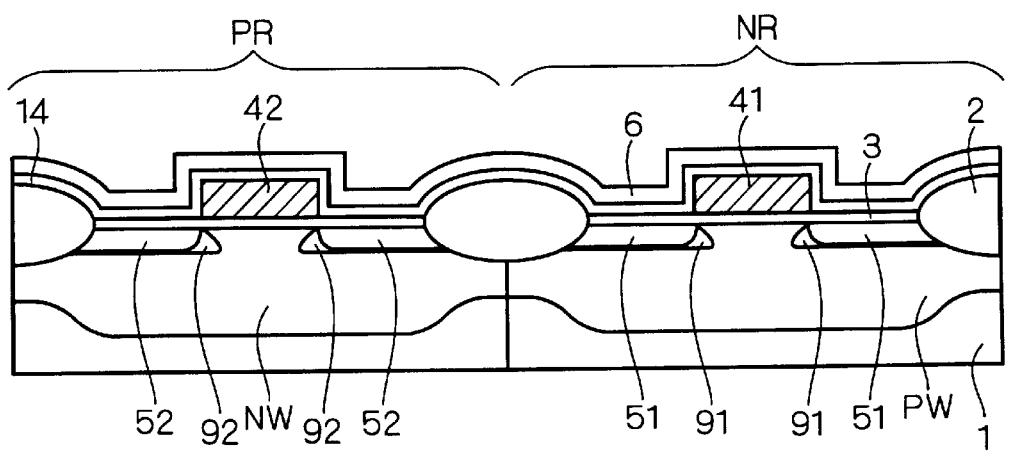

After the resist mask R16 is removed, a silicon oxide film 6 having a thickness of 10 to 200 nm is formed by the CVD method to cover a whole upper surface of the protective insulating film 14 at a step shown in FIG. 17.

At a step shown in FIG. 18, subsequently, the protective insulating film 14 and the silicon oxide film 6 are removed by anisotropic etching together with the gate insulating film 3 provided over the silicon substrate 1 on the outside of side surfaces of the gate electrodes 41 and 42 such that the protective insulating film 14 and the silicon oxide film 6 remain in side wall portions of the gate electrodes 41 and 42. Thus, a side wall protective film (side wall insulating film) 16 is formed.

The side wall protective film 16 has a two-layered structure constituted by the protective insulating film 14 and the silicon oxide film 6, and is also formed on the gate insulating film 3 over the silicon substrate 1 on the outside of the side surfaces of the gate electrodes 41 and 42.

Through the same step as that described with reference to FIG. 8, subsequently, a P-type impurity ion such as boron or $BF_2$ is implanted into the silicon substrate 1 by using the gate electrode 42 and the side wall protective film 16 as implantation masks in the PMOS region PR. Thus, a pair of main source-drain layers 72 are formed in the surface of the silicon substrate 1. Through the same step as that described with reference to FIG. 9, an N-type impurity ion such as arsenic is implanted into the silicon substrate 1 by using the gate electrode 41 and the side wall protective film 16 as implantation masks in the NMOS region NR. Thus, a pair of main source-drain layers 71 are formed in the surface of the silicon substrate 1. The order of formation of the main source-drain layers 71 and 72 is not restricted to the foregoing.

Then, a heat treatment is carried out for 1 second to 360 minutes at a temperature of 800 to 1100° C. Thus, the main source-drain layers 71 and 72 are activated.

At a step shown in FIG. 19, next, a refractory metal film having a thickness of 1 to 16 nm, for example, a cobalt film (not shown) is formed to cover the whole surface of the silicon substrate 1, and is changed into a silicide by a high temperature treatment. Consequently, cobalt silicide films 8A and 10A are formed in contact portions of exposed surfaces of the silicon substrate 1 and the gate electrodes 41 and 42 with the cobalt film. Then, the cobalt film which has not been changed into the silicide is removed. Thus, the CMOS transistor 200 is obtained.

<B-2. Function and Effect>

While the extension layer 51 in the NMOS region NR is formed prior to the formation of the extension layer 52 in the PMOS region PR in the present embodiment as described above, the extension layer 51 is simply subjected to the etching for removing the resist mask R15 in the PMOS region PR after the extension layer 51 is formed at the step shown in FIG. 13. Then, the extension layer 51 is covered and protected with the protective insulating film 14 and is not therefore subjected to the etching. Thus, the etching amount is more reduced than that in the conventional manufacturing method in which the extension layer 51 is subjected to the etching twice.

As a result, the junction depth of the extension layer 51 is reduced so that a resistance value, that is, a parasitic resistance value can be prevented from being increased and a current driving capability can be prevented from being deteriorated. Thus, it is possible to prevent an operating speed of a semiconductor integrated circuit from being reduced.

Moreover, the arsenic or phosphorus constituting the extension layer 51 has a smaller diffusion coefficient than that of the boron constituting the extension layer 52. In the case in which the extension layer 51 is to be provided after the formation of the extension layer 52, the boron of the extension layer 52 is too diffused on the same condition if the heat treatment for activating the extension layer 51 is carried out. Therefore, the sufficient heat treatment (at a high temperature for a long time) for activating the extension layer 52 cannot be carried out. However, the extension layer 51 can be formed earlier in the present embodiment. Therefore, the heat treatment for activating the extension layer 51 can be carried out immediately after the formation of the extension layer 51 and it is possible to reliably recover the damage of the substrate caused by the ion implantation and carry out the diffusion of the impurity.

The heat treatment is also carried out after the formation of the extension layer 52. Also in that case, the conditions of the heat treatment to be carried out immediately after the formation of the extension layer 51 are set in consideration of the fact that the activation of the extension layer 51 is promoted.

The protective insulating film 14 may be formed immediately after the gate electrodes 41 and 42 are patterned on the NMOS region NR and the PMOS region PR and the extension layers 51 and 52 may be formed in the NMOS region NR and the PMOS region PR. In this case, the arsenic or phosphorus constituting the extension layer 51 is implanted into the protective insulating film 14 and the gate insulating film 3 in the same manner as the boron or $BF_2$ constituting the extension layer 52 and is diffused through the heat treatment so that the extension layers 51 and 52 to be shallow diffusion layers are formed in the silicon substrate 1. In particular, the arsenic is diffused into the silicon oxide film with difficulty. Therefore, it is desirable that the extension layer 51 for implantation in a closer position to the silicon substrate 1 should be formed earlier and be heat treated and the heat treatment should be carried out again by utilizing the heat treatment for diffusion in the extension layer 52 after the formation of the extension layer 52.

<B-3. Variant>

Although the protective insulating film 14 is formed by the CVD method in the above description, it may be formed by a thermal oxidizing method in place of the CVD method. By forming the protective insulating film 14 to be a protective insulating film on the substrate surface by the thermal oxidation capable of easily controlling a film thickness, it is possible to reduce a variation in a device characteristic which is caused by a variation in the film thickness.

Moreover, the protective insulating film to be provided on the surface of the substrate is not restricted to the silicon oxide film but a silicon nitride film formed by the CVD method may be used in place of the silicon oxide film.

The silicon nitride film is etched by the aqueous ammonia peroxide with more difficulty than the silicon oxide film. Therefore, a thickness is set to 1 to 15 nm which is smaller than that in the case in which the silicon oxide film is used. Consequently, the influence on the device characteristic can be relieved.

Furthermore, the silicon nitride film may be formed by a thermal nitriding method. By the formation using the thermal nitriding method capable of easily controlling a film thickness, it is possible to reduce a variation in a device characteristic which is caused by a variation in the film thickness.

<C. Third Embodiment>

In the first and second embodiments described above, one kind of CMOS transistor has been taken as an example and the method of preventing the etching of the semiconductor substrate in the NMOS region has particularly been described. In a third embodiment according to the present invention, description will be given to a method of preventing etching of a semiconductor substrate in an NMOS region by taking, as an example, two kinds of CMOS transistors for operating at different supply voltages.

<C-1. Manufacturing Method>

As the third embodiment according to the present invention with reference to FIGS. 20 to 33, description will be given to a method of manufacturing a semiconductor device having a low voltage CMOS transistor 100A and a high voltage CMOS transistor 100B. Structures of the low voltage CMOS transistor 100A and the high voltage CMOS transistor 100B are shown in FIG. 33 illustrating a final step. The same structures as those in the first embodiment have the same reference numerals and repetitive description will be omitted.

Figure 20:
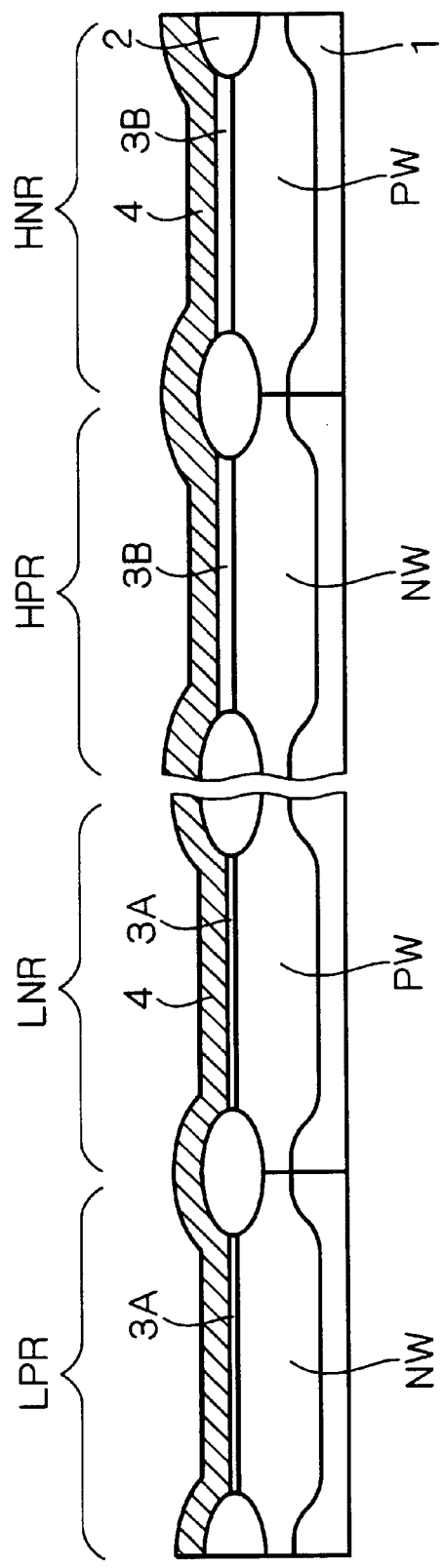
FIGS. 20 to 33 are sectional views showing a process for manufacturing a semiconductor device according to a third embodiment of the present invention.

At a step shown in FIG. 20, first of all, an element isolating film 2 is selectively formed in a surface of a silicon substrate 1 to define a low voltage NMOS region LNR and a low voltage PMOS region LPR where a low voltage NMOS transistor and a low voltage PMOS transistor are to be formed, and to define a high voltage NMOS region HNR and a high voltage PMOS region HPR where a high voltage NMOS transistor and a high voltage PMOS transistor are to be formed.

Then, a P well region PW containing a P-type impurity and an N well region NW containing an N-type impurity are formed in the surface of the silicon substrate 1 corresponding to the low voltage NMOS region LNR and high voltage NMOS region HNR and the low voltage PMOS region LPR and high voltage PMOS region HPR.

Furthermore, a gate insulating film 3A is formed by a silicon oxide film, a silicon nitride film, a metal oxide film or a multilayered film constituted by a combination thereof over whole surfaces of the low voltage NMOS region LNR and the low voltage PMOS region LPR in the silicon substrate 1. Moreover, a gate insulating film 3B is formed by a silicon oxide film, a silicon nitride film, a metal oxide film or a multilayered film constituted by a combination thereof over a whole surface of the high voltage NMOS region HNR and the high voltage PMOS region HPR in the silicon substrate 1.

A thickness of the gate insulating film 3A is set to be approximately 1 nm to 4 nm through a conversion into the silicon oxide film and a thickness of the gate insulating film 3B is set to be approximately 5 nm to 10 nm through a conversion into the silicon oxide film.

Then, a polysilicon film 4 having a thickness of 50 to 300 nm is formed by a CVD method over whole upper surfaces of the gate insulating films 3A and 3B.

Figure 21:
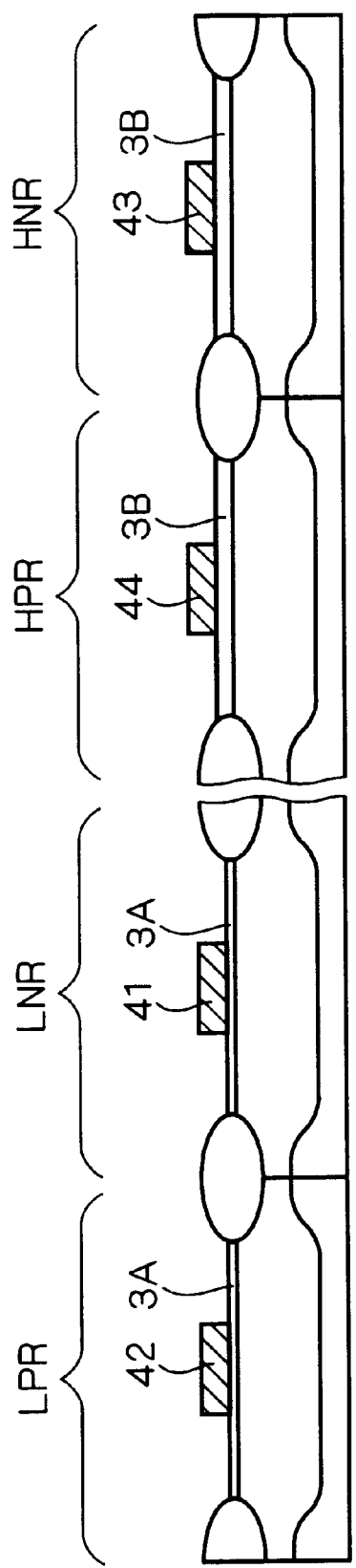

Next, a resist (not shown) is provided over a whole surface of the polysilicon film 4 at a step shown in FIG. 21, and is then subjected to patterning by photolithography, thereby forming a resist mask. Then, the polysilicon film 4 is subjected to the patterning by using the resist mask. Consequently, gate electrodes 41 and 42 are formed on the low voltage NMOS region LNR and the low voltage PMOS region LPR respectively, and gate electrodes 43 and 44 are formed on the high voltage NMOS region HNR and the high voltage PMOS region HPR respectively.

Figure 22:
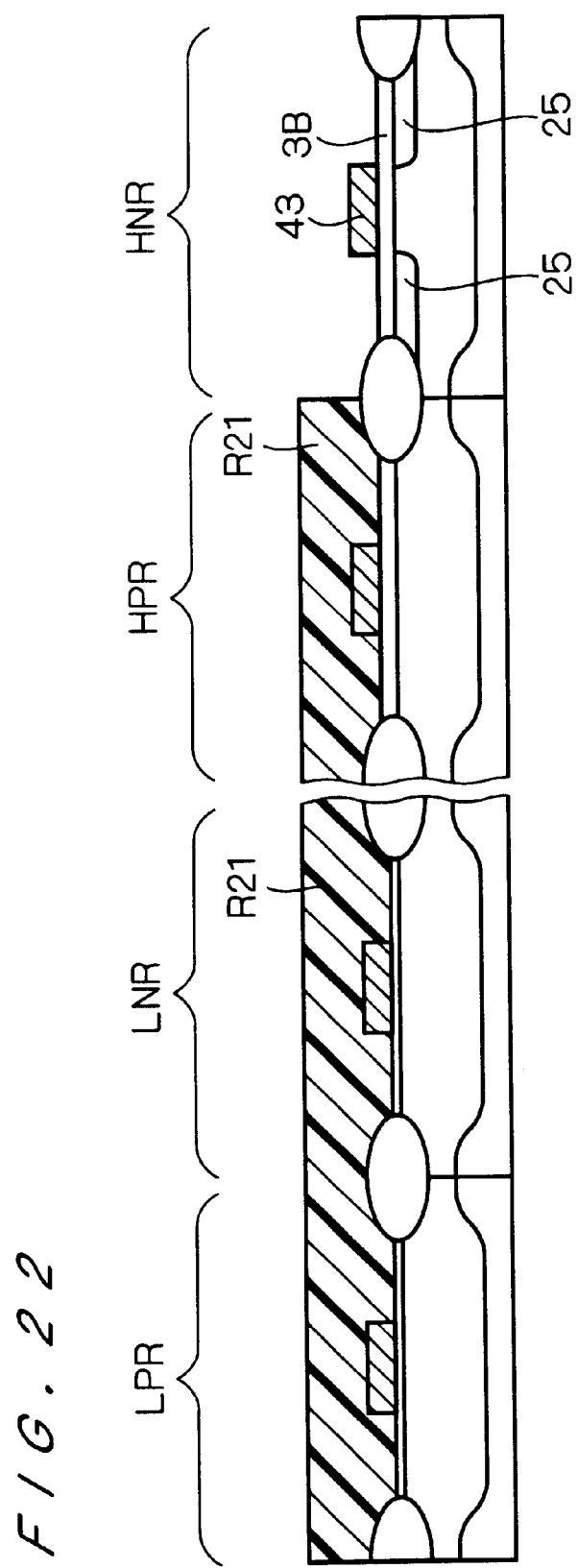

Next, a resist mask R21 is formed to cover the low voltage NMOS region LNR, the low voltage PMOS region LPR and the high voltage PMOS region HPR by photolithography at a step shown in FIG. 22. In the high voltage NMOS region HNR, then, an arsenic or phosphorus ion is implanted into the silicon substrate 1 by using the gate electrode 43 as an implantation mask to form a pair of extension layers 25 in the surface of the silicon substrate 1. For the conditions of implantation, an implantation energy is set to 1 keV to 50 keV and a dose amount is set to $1\times10^{13}$ to $1\times10^{15}/cm^2$.

The extension layers 25 are provided opposite to each other by interposing a region of the silicon substrate 1 provided under the gate electrode 43 therebetween. The region of the silicon substrate 1 which is provided under the gate electrode 43 acts as a channel region.

Figure 23:
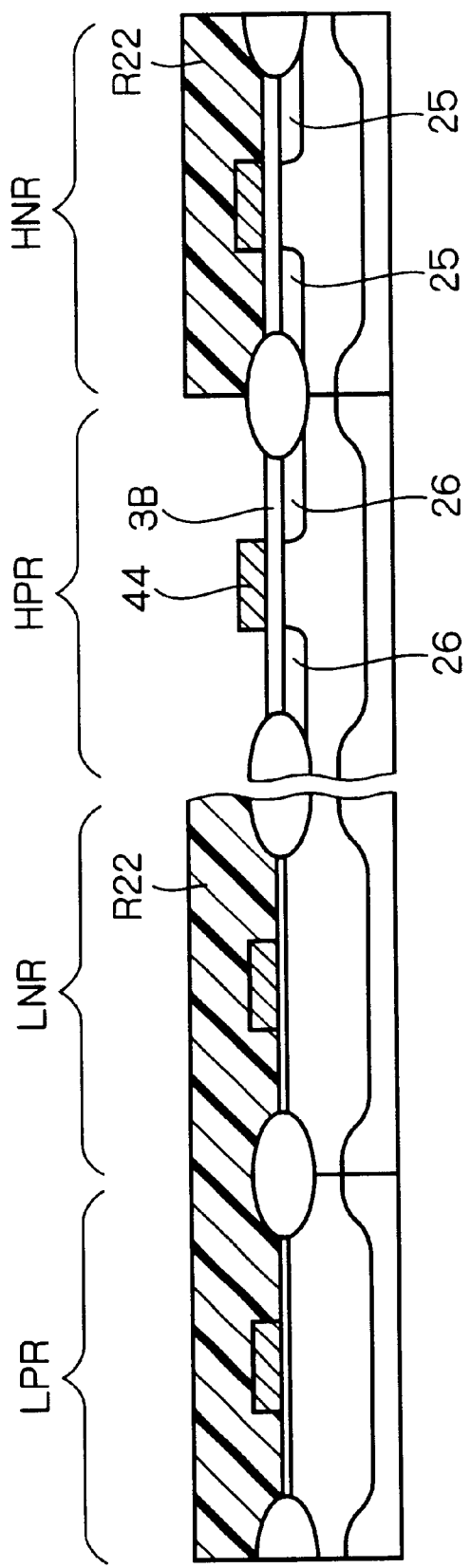

After the resist mask R21 is removed, a resist mask R22 is formed to cover the low voltage NMOS region LNR, the low voltage PMOS region LPR and the high voltage NMOS region HNR by the photolithography at a step shown in FIG. 23. In the high voltage PMOS region HPR, then, a boron or $BF_2$ ion is implanted into the silicon substrate 1 by using the gate electrode 44 as an implantation mask to form a pair of extension layers 26 in the surface of the silicon substrate 1. For the conditions of implantation, an implantation energy is set to 1 keV to 50 keV and a dose amount is set to $1\times10^{13}$ to $1\times10^{15}/cm^2$.

The extension layers 26 are provided opposite to each other by interposing a region of the silicon substrate 1 provided under the gate electrode 44 therebetween. The region of the silicon substrate 1 which is provided under the gate electrode 44 acts as a channel region.

The extension layers 25 and 26 of the high voltage CMOS transistor have a peak of an impurity at a depth of approximately 0.1 $\mu$m, and a peak concentration is set to be approximately $1\times10^{18}/cm^3$. This setting is carried out to suppress the generation of hot carriers caused by a high supply voltage and can also be referred to as an LDD (Lightly Doped Drain) layer.

Figure 24:
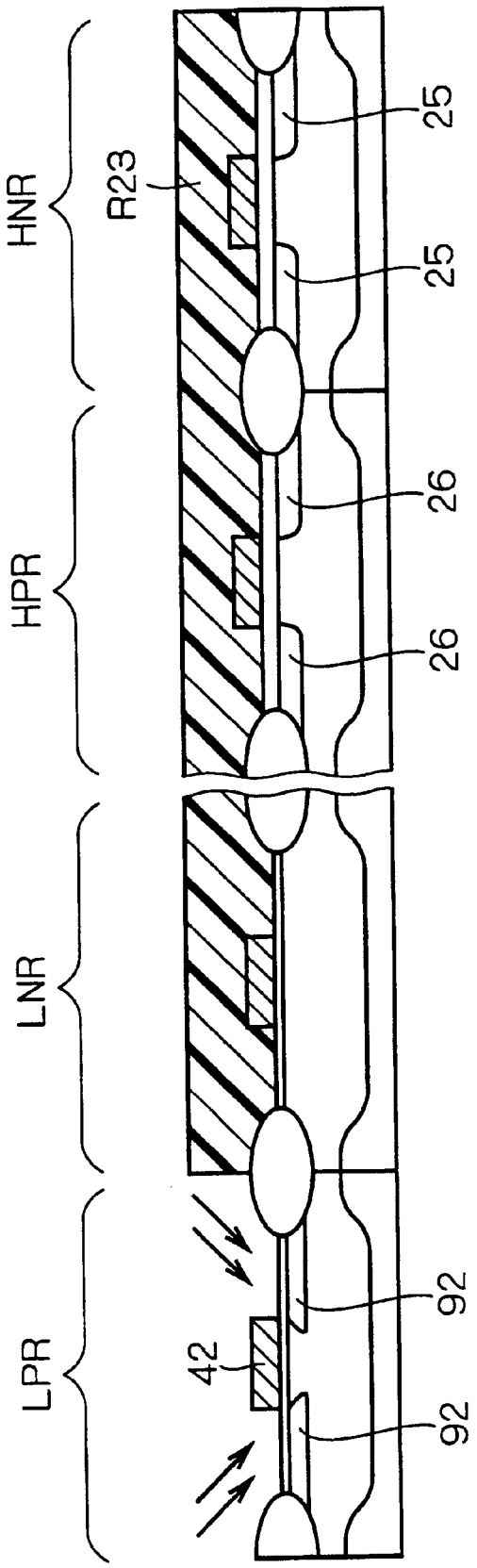

After the resist mask R22 is removed, a resist mask R23 is formed to cover the low voltage NMOS region LNR, the high voltage NMOS region HNR and the high voltage PMOS region HPR by the photolithography at a step shown in FIG. 24.

Then, the silicon substrate 1 is inclined at a maximum angle of approximately 60°, and an N-type impurity ion such as arsenic or phosphorus is implanted into the silicon substrate 1 in the low voltage PMOS region LPR, thereby forming a pocket layer 92. For the conditions of implantation, an implantation energy is set to 1 keV to 50 keV and a dose amount is set to $1\times10^{13}$ to $1\times10^{14}/cm^2$.

The pocket layer 92 is formed to be extended in an oblique direction to a main surface of the silicon substrate 1 and has a tip portion extended to a region provided under the gate electrode 42.

Figure 25:
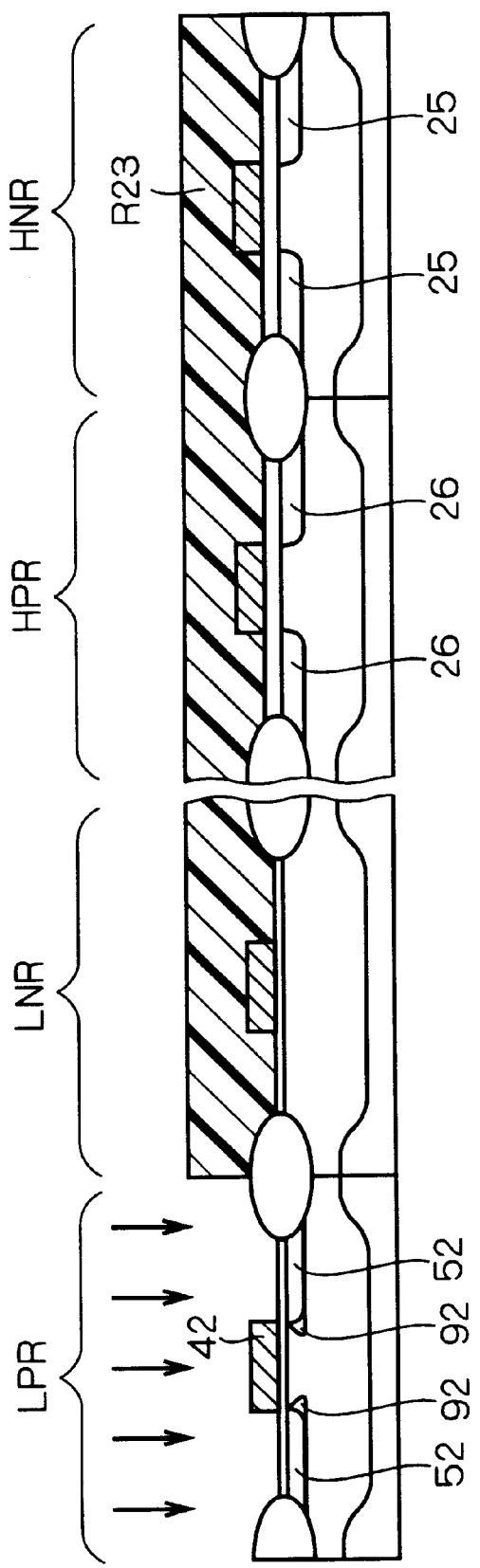
Figure 26:
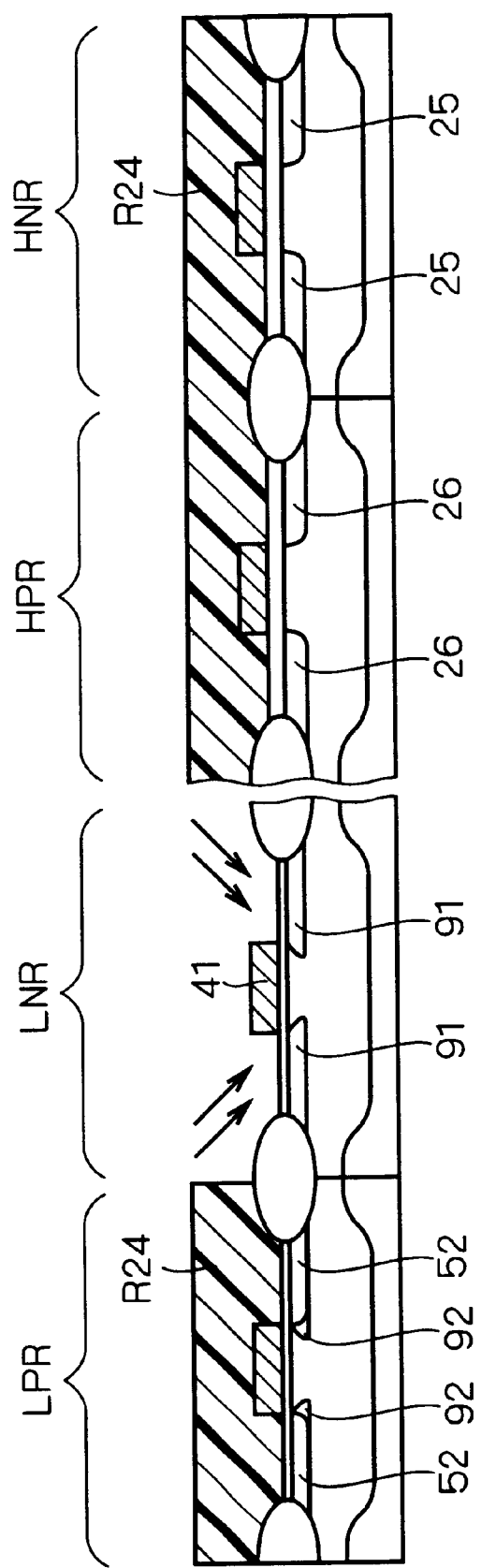

At a step shown in FIG. 25, next, the inclination of the silicon substrate 1 is restored and a boron or $BF_2$ ion is implanted into the silicon substrate 1 by using the gate electrode 42 as an implantation mask to form a pair of extension layers 52 in the surface of the silicon substrate 1. For the conditions of implantation, an implantation energy is set to 1 keV to 50 keV and a dose amount is set to $1\times10^{13}$ to $4\times10^{15}/cm^2$.

The extension layers 52 are provided opposite to each other by interposing a region of the silicon substrate 1 provided under the gate electrode 42 therebetween. The region of the silicon substrate 1 which is provided under the gate electrode 42 acts as a channel region.

Subsequently, the resist mask R23 is removed. Then, a resist mask R24 is formed to cover the low voltage PMOS region LPR, the high voltage NMOS region HNR and the high voltage PMOS region HPR by the photolithography at a step shown in FIG. 26. Thereafter, the silicon substrate 1 is inclined at a maximum angle of approximately 60°, and a P-type impurity ion such as boron is implanted into the silicon substrate 1 in the low voltage NMOS region LNR, thereby forming a pocket layer 91. For the conditions of implantation, an implantation energy is set to 1 keV to 50 keV and a dose amount is set to $1\times10^{13}$ to $1\times10^{14}/cm^2$.

The pocket layer 91 is formed to be extended in an oblique direction to a main surface of the silicon substrate 1 and has a tip portion extended to a region provided under the gate electrode 41.

Figure 27:
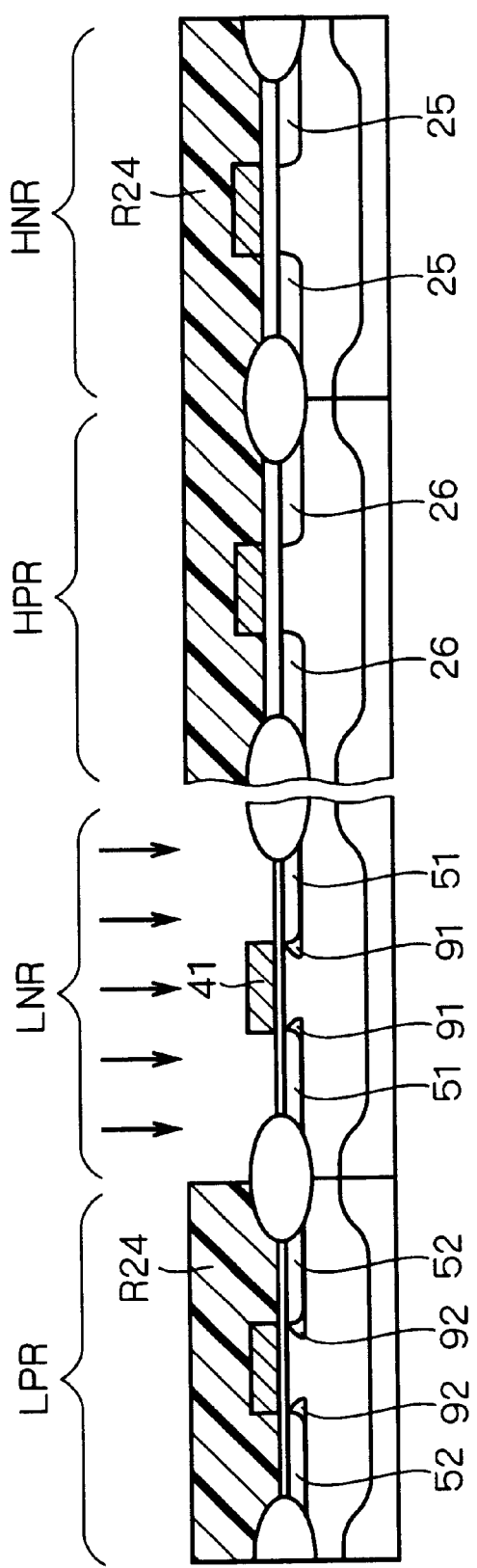

At a step shown in FIG. 27, next, the inclination of the silicon substrate 1 is restored and an arsenic or phosphorus ion is implanted into the silicon substrate 1 by using the gate electrode 41 as an implantation mask to form a pair of extension layers 51 in the surface of the silicon substrate 1. For the conditions of implantation, an implantation energy is set to 1 keV to 50 keV and a dose amount is set to $1\times10^{13}$ to $4\times10^{15}/cm^2$.

The extension layers 51 are provided opposite to each other by interposing a region of the silicon substrate 1 provided under the gate electrode 41 therebetween. The region of the silicon substrate 1 which is provided under the gate electrode 41 acts as a channel region.

Figure 28:
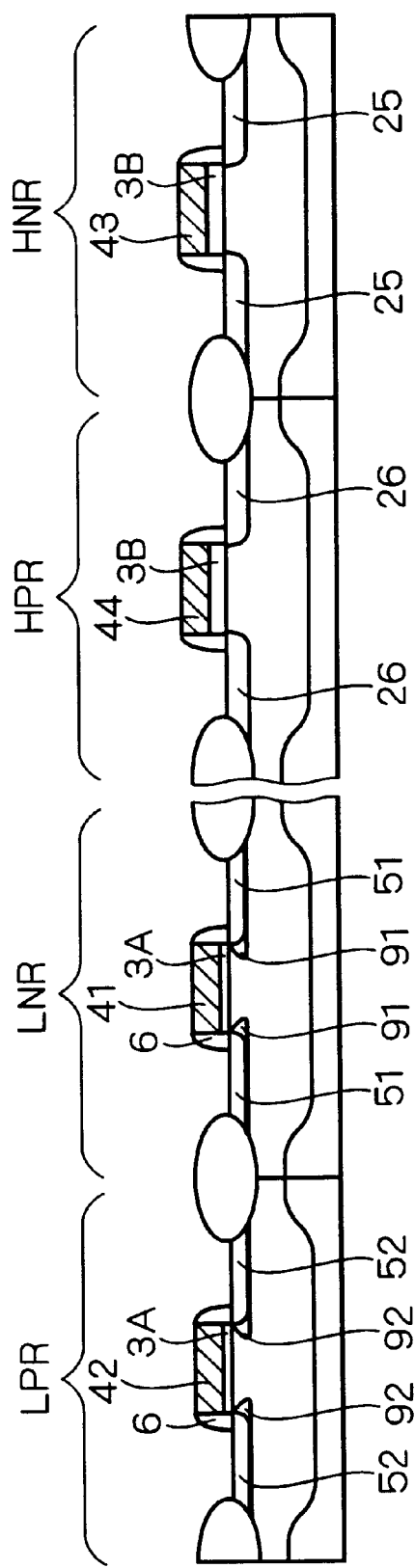

After the resist mask R24 is removed, a silicon oxide film (not shown) having a thickness of 10 to 200 nm is formed by a CVD method to cover the whole surface of the silicon substrate 1, the silicon oxide film is then removed by anisotropic etching together with the gate insulating film 3A provided over the silicon substrate 1 on the outside of side surfaces of the gate electrodes 41 and 42 and the gate insulating film 3B provided over the silicon substrate 1 on the outside of side surfaces of the gate electrodes 43 and 44 such that it remains in only side wall portions of the gate electrodes 41 to 44 at a step shown in FIG. 28. Thus, a side wall protective film (side wall insulating film) 6 is formed. The side wall protective film is not restricted to the silicon oxide film but may be a silicon nitride film or a layered film of the silicon oxide film and the silicon nitride film.

Moreover, the side wall protective film 6 is also formed on the gate insulating film 3A provided over the silicon substrate 1 on the outside of the side surfaces of the gate electrodes 41 and 42 and on the gate insulating film 3B provided over the silicon substrate 1 on the outside of the side surfaces of the gate electrodes 43 and 44, and the gate insulating films 3A and 3B and the side wall protective film 6 constitute a two-layered structure. For simplicity, the side wall protective film 6 having a single layer is shown in and after FIG. 28.

Figure 29:
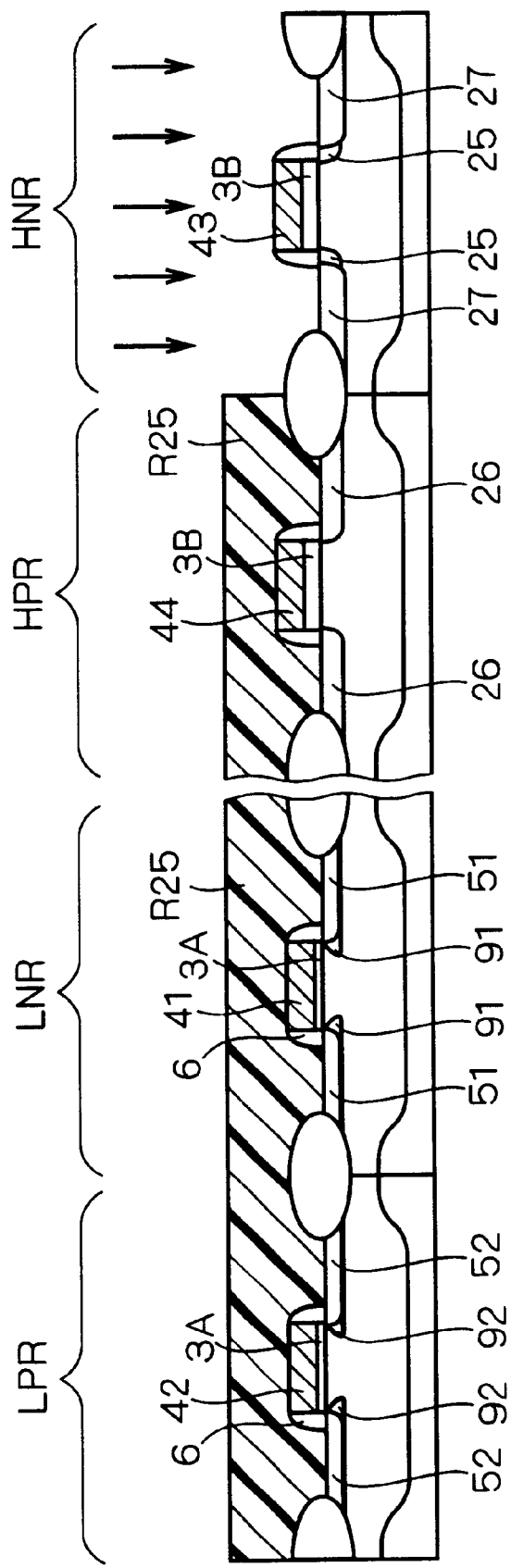

At a step shown in FIG. 29, next, a resist mask R25 is formed to cover the low voltage NMOS region LNR, the low voltage PMOS region LPR and the high voltage PMOS region HPR. Then, an N-type impurity ion such as arsenic is implanted into the silicon substrate 1 by using the gate electrode 43 and the side wall protective film 6 as implantation masks. Thus, a pair of main source-drain layers 27 are formed in the surface of the silicon substrate 1. For the conditions of implantation, an implantation energy is set to 10 keV to 100 keV and a dose amount is set to $1 \times 10^{14}$ to $1 \times 10^{16}/cm^2$.

Figure 30:
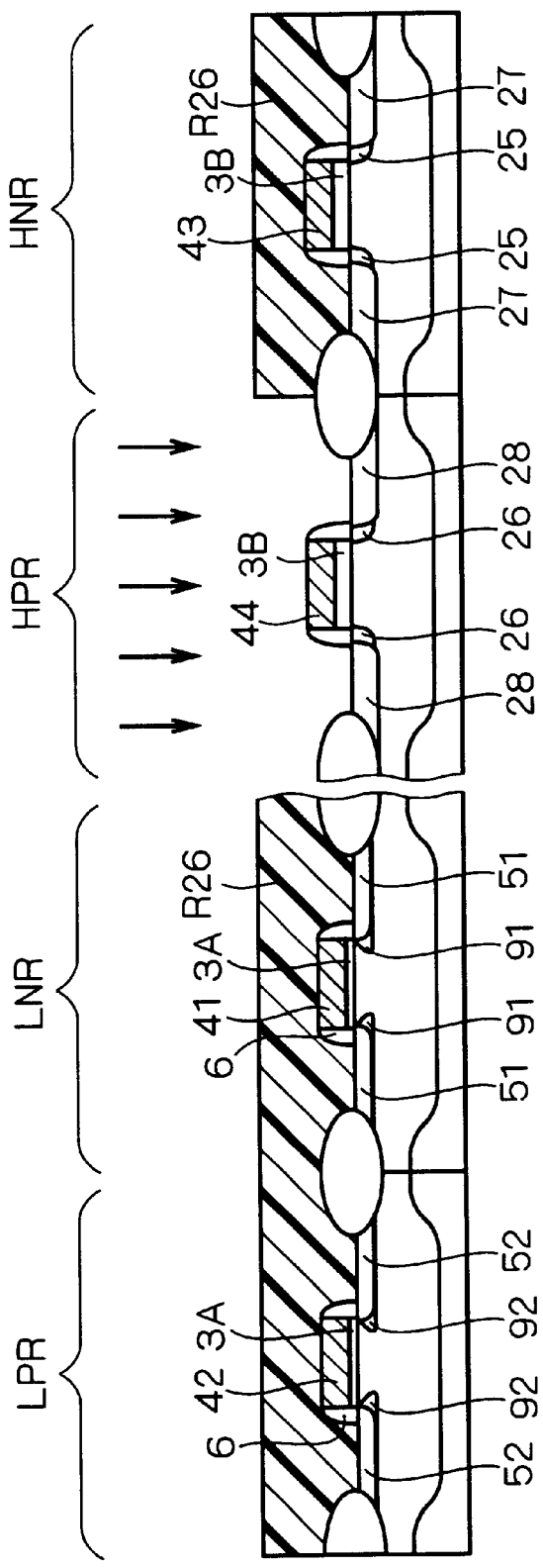
Figure 31:
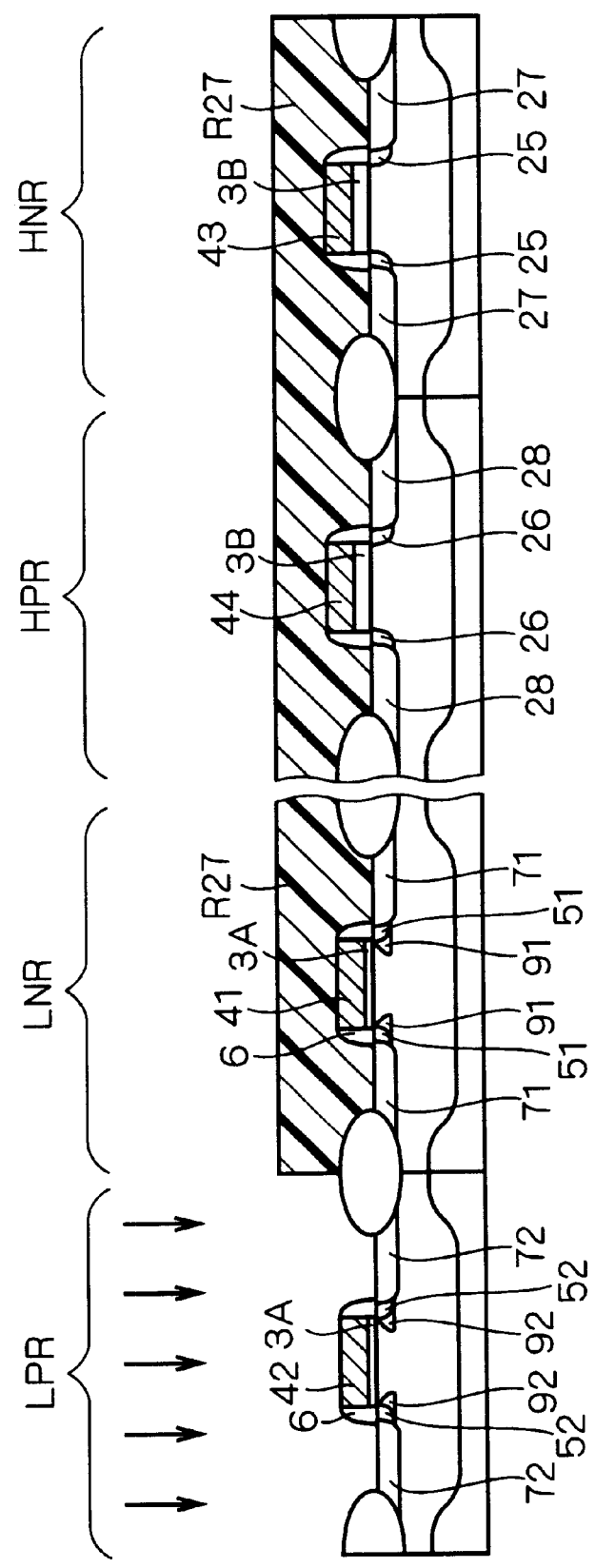

After the resist mask R25 is removed, a resist mask R26 is formed to cover the low voltage NMOS region LNR, the low voltage PMOS region LPR and the high voltage NMOS region HNR by the photolithography at a step shown in FIG. 30. Then, a P-type impurity ion such as boron or $BF_2$ is implanted into the silicon substrate 1 by using the gate electrode 44 and the side wall protective film 6 as implantation masks. Thus, a pair of main source-drain layers 28 are formed in the surface of the silicon substrate 1. For the conditions of implantation, an implantation energy is set to 10 keV to 100 keV and a dose amount is set to $1 \times 10^{14}$ to $1 \times 10^{16}/cm^2$.

Next, the resist mask R26 is removed. At a step shown in FIG. 31, then, a resist mask R27 is formed to cover the low voltage NMOS region LNR, the high voltage NMOS region HNR and the high voltage PMOS region HPR by the photolithography. Then, a P-type impurity ion such as boron or $BF_2$ is implanted into the silicon substrate 1 by using the gate electrode 42 and the side wall protective film 6 as implantation masks in the low voltage PMOS region LPR. Thus, a pair of main source-drain layers 72 are formed in the surface of the silicon substrate 1. For the conditions of implantation, an implantation energy is set to 10 keV to 100 keV and a dose amount is set to $1 \times 10^{14}$ to $1 \times 10^{16}/cm^2$.

Figure 32:
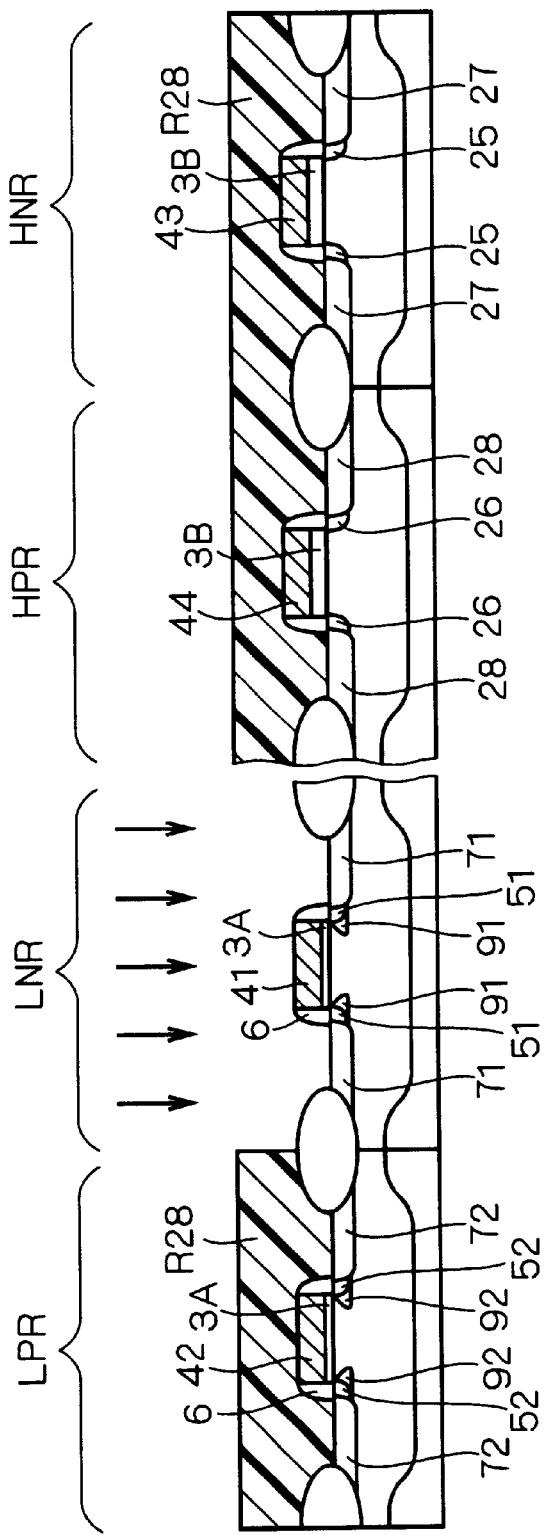
Figure 33:
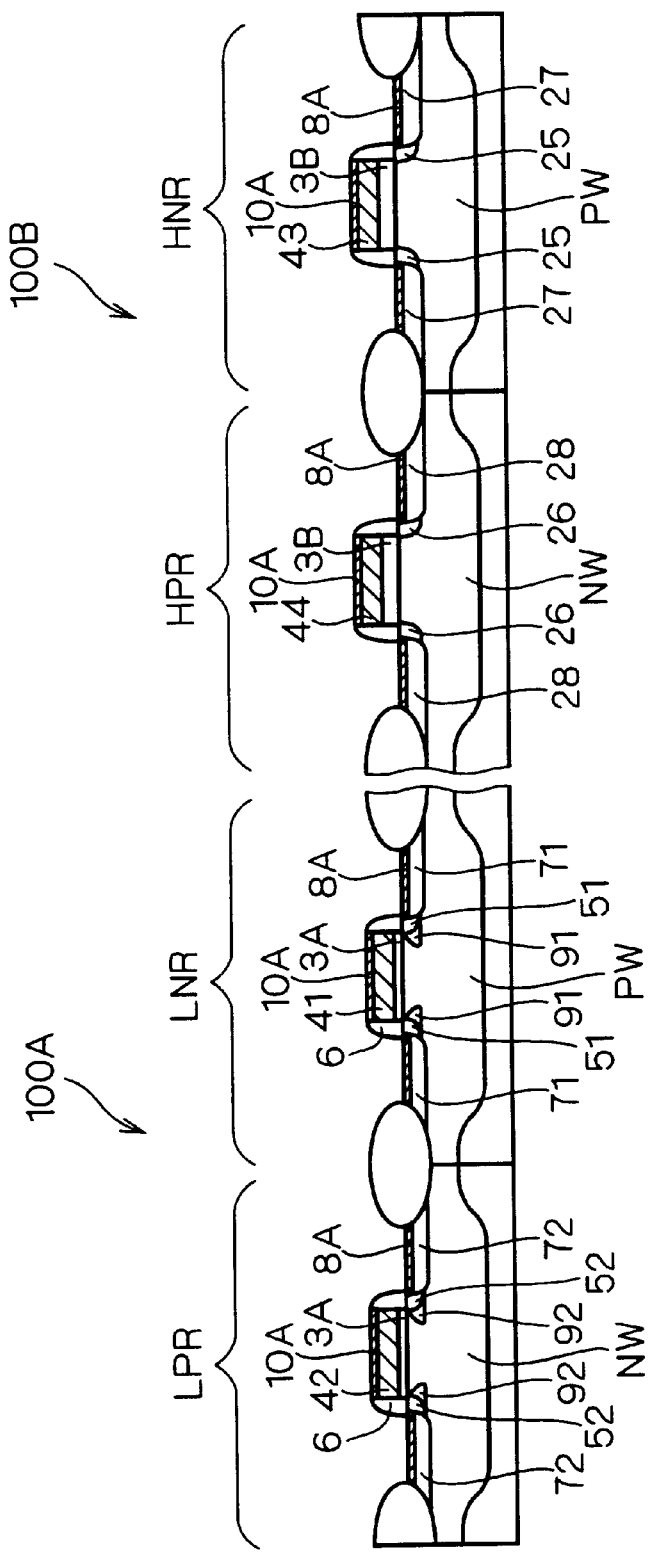

After the resist mask R27 is removed, a resist mask R28 is formed to cover the low voltage PMOS region LPR, the high voltage NMOS region HNR and the high voltage PMOS region HPR by the photolithography at a step shown in FIG. 32. Then, an N-type impurity ion such as arsenic is implanted into the silicon substrate 1 by using the gate electrode 41 and the side wall protective film 6 as implantation masks in the low voltage NMOS region LNR. Thus, a pair of main source-drain layers 71 are formed in the surface of the silicon substrate 1. For the conditions of implantation, an implantation energy is set to 10 keV to 100 keV and a dose amount is set to $1 \times 10^{14}$ to $1 \times 10^{16}/cm^2$.

Then, a heat treatment is carried out for 1 second to 360 minutes at a temperature of 800 to 1100° C. Thus, the main source-drain layers 71, 72, 27 and 28 are activated.

At a step shown in FIG. 33, next, a refractory metal film having a thickness of 1 to 16 nm, for example, a cobalt film (not shown) is formed to cover the whole surface of the silicon substrate 1, and is changed into a silicide by a high temperature treatment. Consequently, cobalt silicide films 8A and 10A are formed in contact portions of exposed surfaces of the silicon substrate 1 and the gate electrodes 41 to 44 with the cobalt film. Then, the cobalt film which has not been changed into the silicide is removed. Thus, the low voltage CMOS transistor 100A and the high voltage CMOS transistor 100B are obtained.

<C-2. Function and Effect>

As described above, a photolithographic process should be carried out four times for forming a resist mask in each of the low voltage CMOS transistor and the high voltage CMOS transistor in order to provide the extension layer and the main source-drain layers in two kinds of CMOS transistors for operating at different supply voltages.

However, the extension layer 51 of the low voltage NMOS region LNR is finally formed. Consequently, the extension layer 51 finally remaining in the CMOS transistor 100A is simply subjected to the etching when the resist mask R24 is to be removed. Thus, an etching amount is reduced.

As a result, a junction depth of the extension layer 51 is reduced so that a resistance value, that is, a parasitic resistance value can be prevented from being increased and a current driving capability can be prevented from being deteriorated. Consequently, it is possible to prevent an operating speed of a semiconductor integrated circuit from being reduced.

The extension layer 52 in the low voltage PMOS region LPR is subjected to the etching twice by the removal of the resist masks R23 and R24. The P-type impurity has a larger diffusion amount than that of the N-type impurity and the extension layer 52 to be a P-type impurity diffusion layer is formed more deeply than the extension layer 51 to be an N-type impurity diffusion layer. Accordingly, even if an amount for removal through the etching is larger than that of the extension layer 52, a resistance of the extension layer 51 is not higher than that of the extension layer 52. In other words, the extension layer 52 has a higher degree of margin for the etching.

Moreover, since the extension layers 51 and 52 of the low voltage CMOS transistor are shallower than the high voltage CMOS transistors 25 and 26, they are easily affected by the etching. Therefore, the extension layers 51 and 52 of the low voltage CMOS transistor are formed after the formation of the high voltage CMOS transistors 25 and 26. Consequently, the number of times at which the extension layers 51 and 52 are subjected to the etching can be reduced so that the parasitic resistance cam be prevented from being increased. Furthermore, a channel resistance of the low voltage CMOS transistor is lower than that of the high voltage CMOS transistor and the low voltage CMOS transistor is influenced more greatly than the high voltage CMOS transistor by an increase in a resistance of a diffusion layer which is the parasitic resistance. Therefore, preferential prevention of an increase in resistance values of the extension layers 51 and 52 of the low voltage CMOS transistor is more effective in that the operating speed of the semiconductor integrated circuit can be prevented from being reduced.

While the two kinds of CMOS transistors for operating at different supply voltages have been taken as an example for the description in the present embodiment, three kinds of supply voltages or more may be applied to the present invention. More specifically, if it is assumed that a CMOS transistor having the lowest supply voltage and a CMOS transistor having a second lowest supply voltage are used for the low voltage CMOS transistor 100A and the high voltage CMOS transistor 100B and the above-mentioned manufacturing method is employed, it is apparent that the number of times at which an extension layer of the CMOS transistor having the lowest supply voltage is subjected to the etching can be reduced.

<D. Fourth Embodiment>

In the first embodiment according to the present invention described above, there has been described the method of finally forming the extension layer 51 of the low voltage NMOS region to reduce the number of times at which the extension layer 51 of the low voltage NMOS region is subjected to the etching, thereby preventing the extension layer 51 from being shallow. In the following fourth embodiment according to the present invention, description will be given to a method of covering an extension layer with a protective insulating film, thereby preventing etching of the extension layer.

<D-1. Manufacturing Method>

Figure 40:
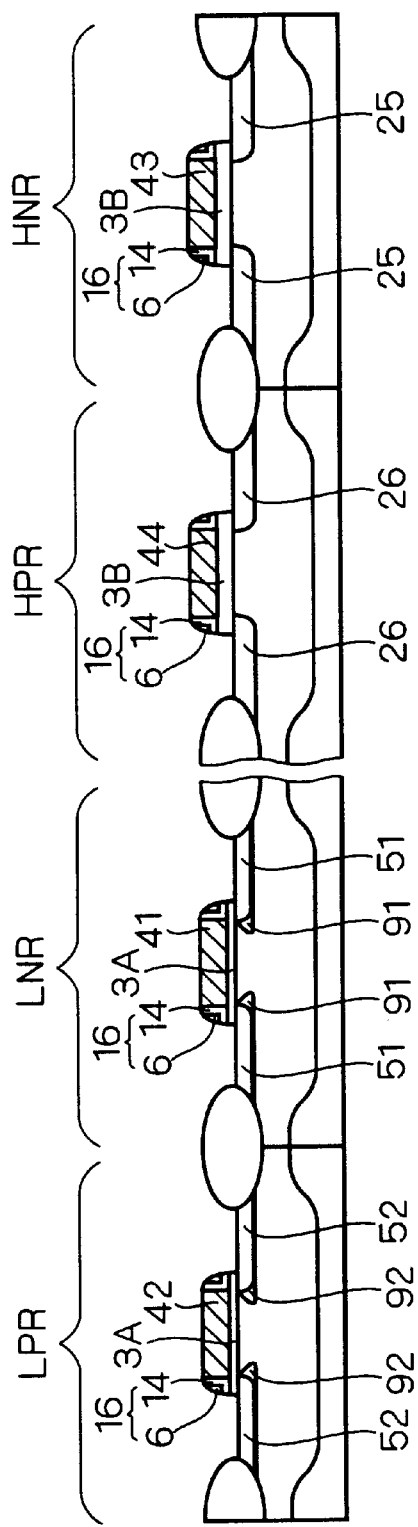
Figure 41:
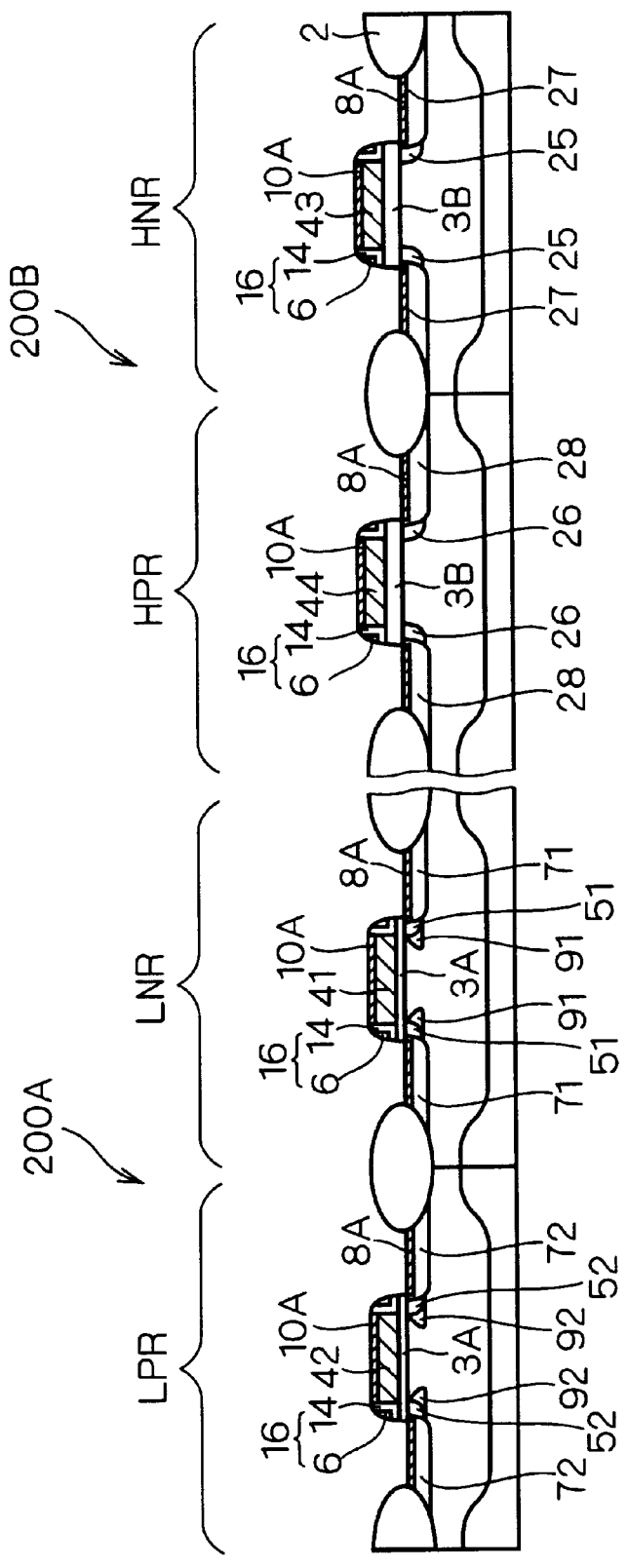
Figure 42:
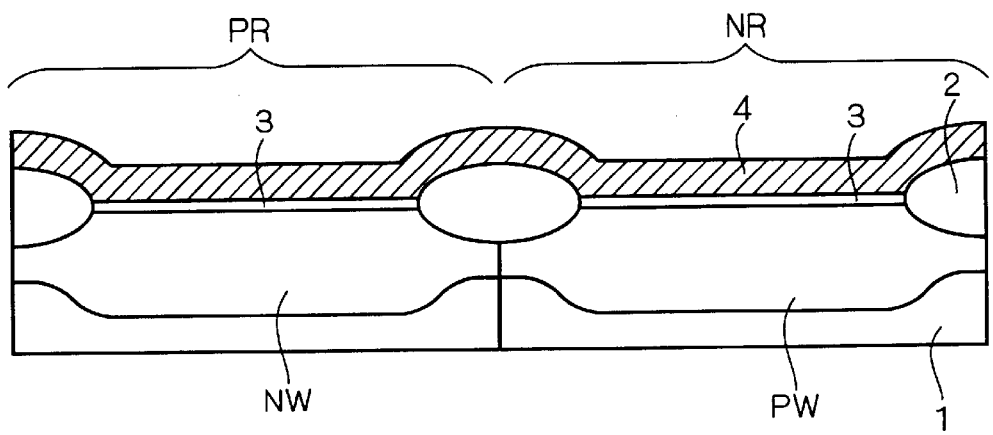
FIGS. 42 and 49 are sectional views showing a conventional process for manufacturing a semiconductor device.
Figure 43:
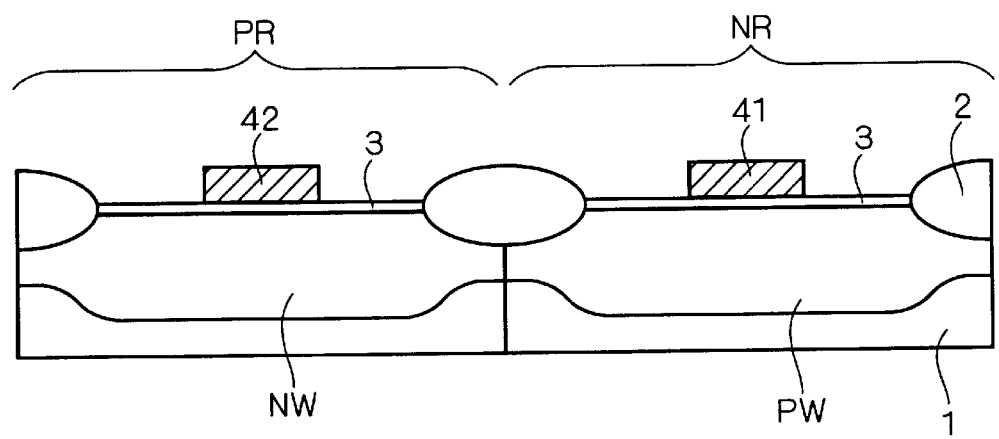
Figure 44:
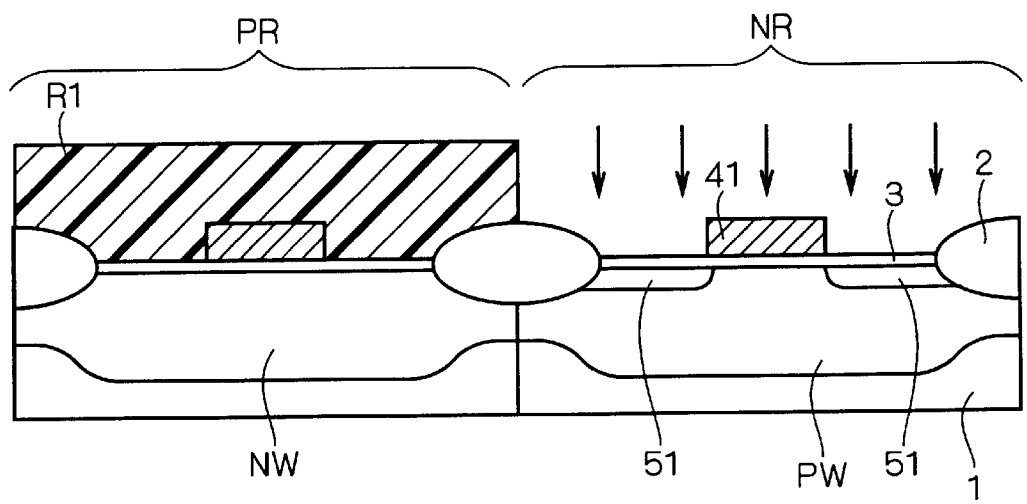
Figure 45:
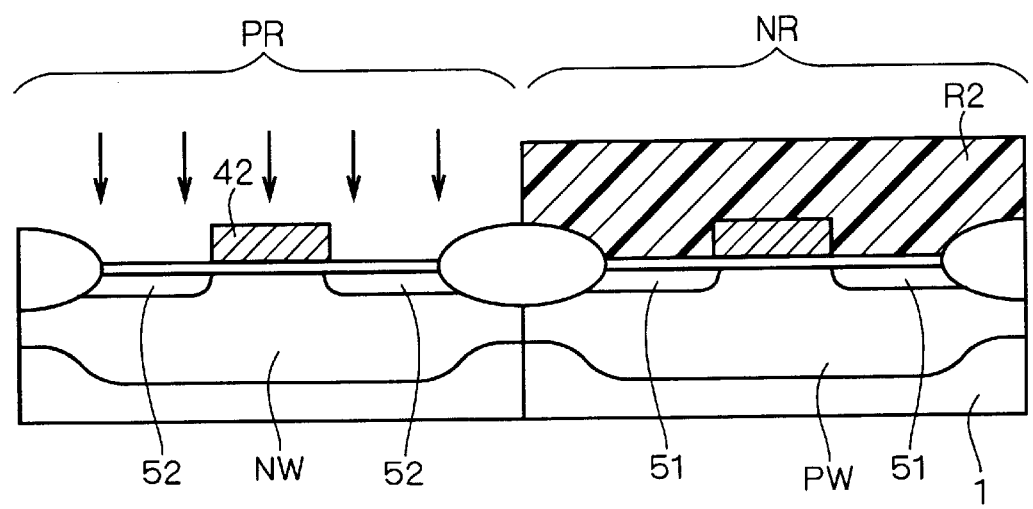
Figure 48:
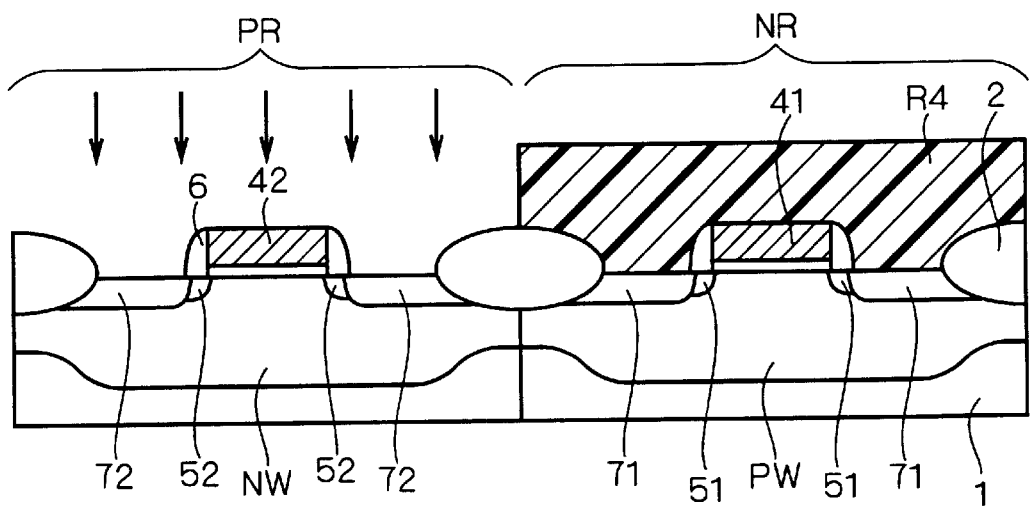
Figure 49:
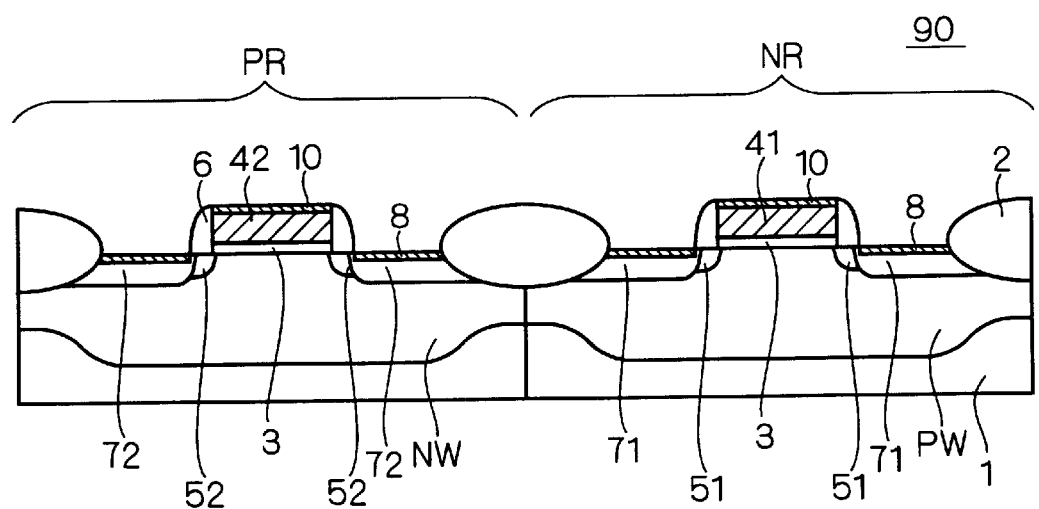

As the fourth embodiment according to the present invention with reference to FIGS. 34 to 41, description will be given to a method of manufacturing a semiconductor device having a low voltage CMOS transistor 200A and a high voltage CMOS transistor 200B. Structures of the low voltage CMOS transistor 200A and the high voltage CMOS transistor 200B are shown in FIG. 41 illustrating a final step. The same structures as those in the third embodiment have the same reference numerals and repetitive description will be omitted.

Through the steps described with reference to FIGS. 20 to 23, first of all, a pair of extension layers 25 are formed in a surface of a silicon substrate 1 in a high voltage NMOS region HNR and a pair of extension layers 26 are formed in the surface of the silicon substrate 1 in a high voltage PMOS region HPR.

Figure 34:
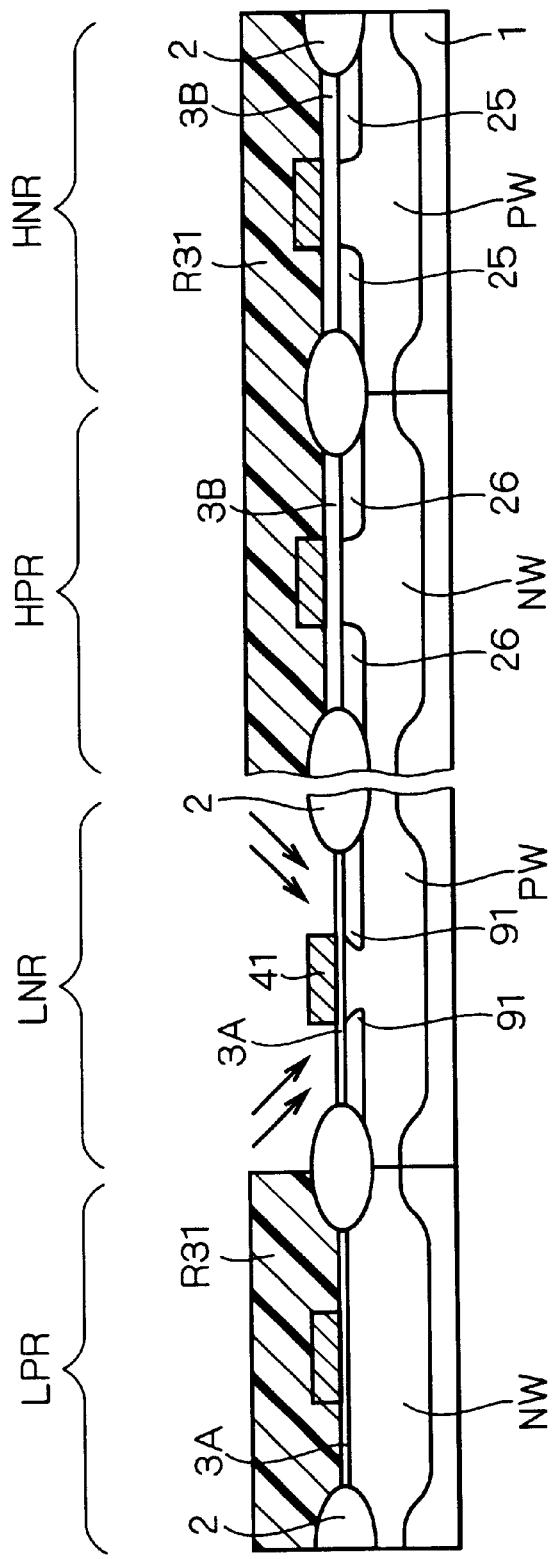
FIGS. 34 to 41 are sectional views showing a process for manufacturing a semiconductor device according to a fourth embodiment of the present invention.

Then, a resist mask R31 is formed to cover a low voltage PMOS region LPR, the high voltage NMOS region HNR and the high voltage PMOS region HPR by photolithography at a step shown in FIG. 34. Thereafter, the silicon substrate 1 is inclined at a maximum angle of approximately 60°, and a P-type impurity ion such as boron is implanted into the silicon substrate 1 in a low voltage NMOS region LNR, thereby forming a pocket layer 91. For the conditions of implantation, an implantation energy is set to 1 keV to 50 keV and a dose amount is set to $1 \times 10^{13}$ to $1 \times 10^{14}/cm^2$.

The pocket layer 91 is formed to be extended in an oblique direction to a main surface of the silicon substrate 1 and has a tip portion extended to a region provided under the gate electrode 41.

Figure 35:
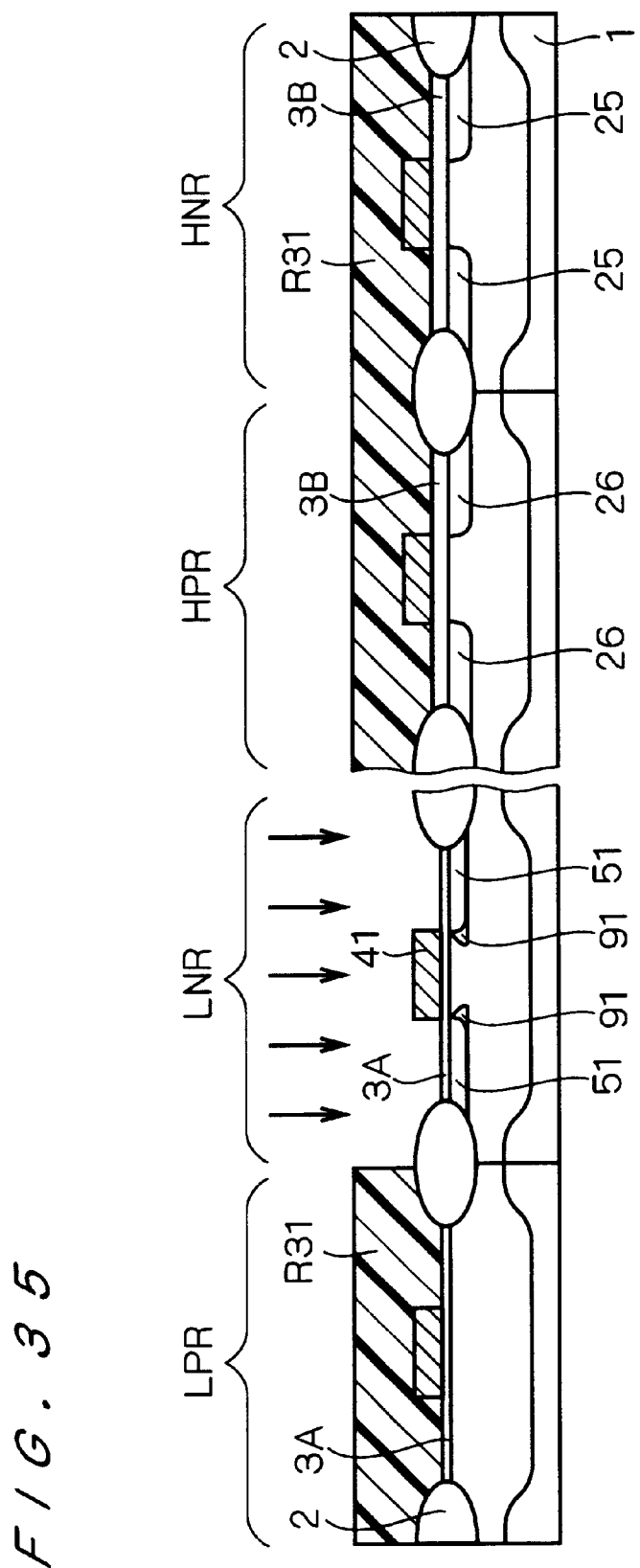
Figure 36:
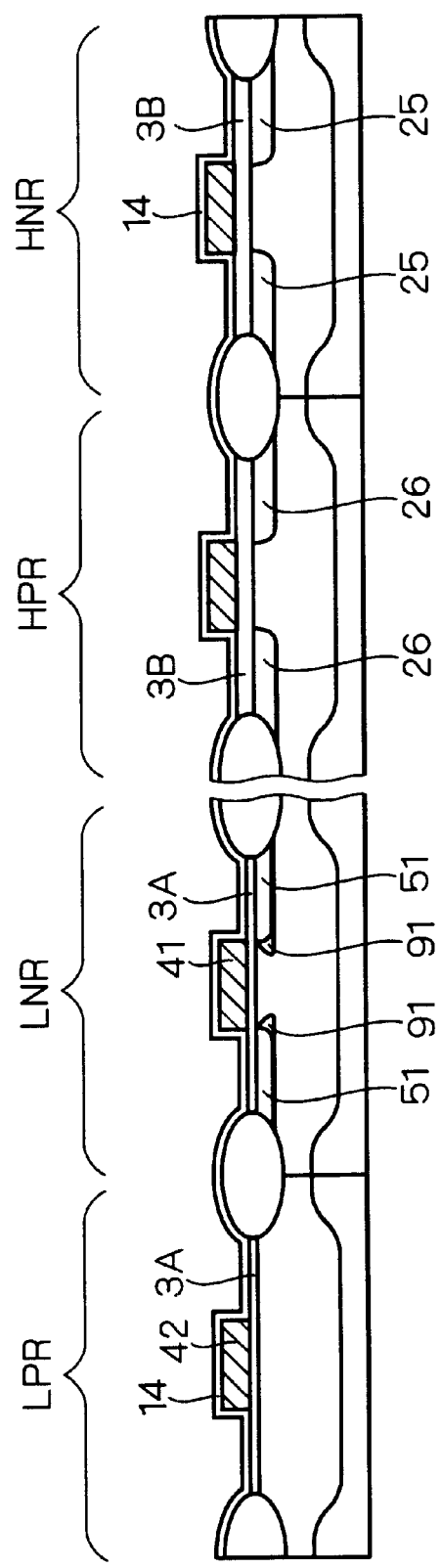

At a step shown in FIG. 35, next, the inclination of the silicon substrate 1 is restored and an arsenic or phosphorus ion is implanted into the silicon substrate 1 by using the gate electrode 41 as an implantation mask to form a pair of extension layers 51 in the surface of the silicon substrate 1. For the conditions of implantation, an implantation energy is set to 1 keV to 50 keV and a dose amount is set to $1 \times 10^{13}$ to $4 \times 10^{15}/cm^2$.

The extension layers 51 are provided opposite to each other by interposing a region of the silicon substrate 1 provided under the gate electrode 41 therebetween. The region of the silicon substrate 1 which is provided under the gate electrode 41 acts as a channel region.

Next, the resist mask R31 is removed. At a step shown in FIG. 36, then, a protective insulating film 14 having a thickness of 1 to 20 nm is formed by a CVD method over the whole surface of the silicon substrate 1.

Figure 37:
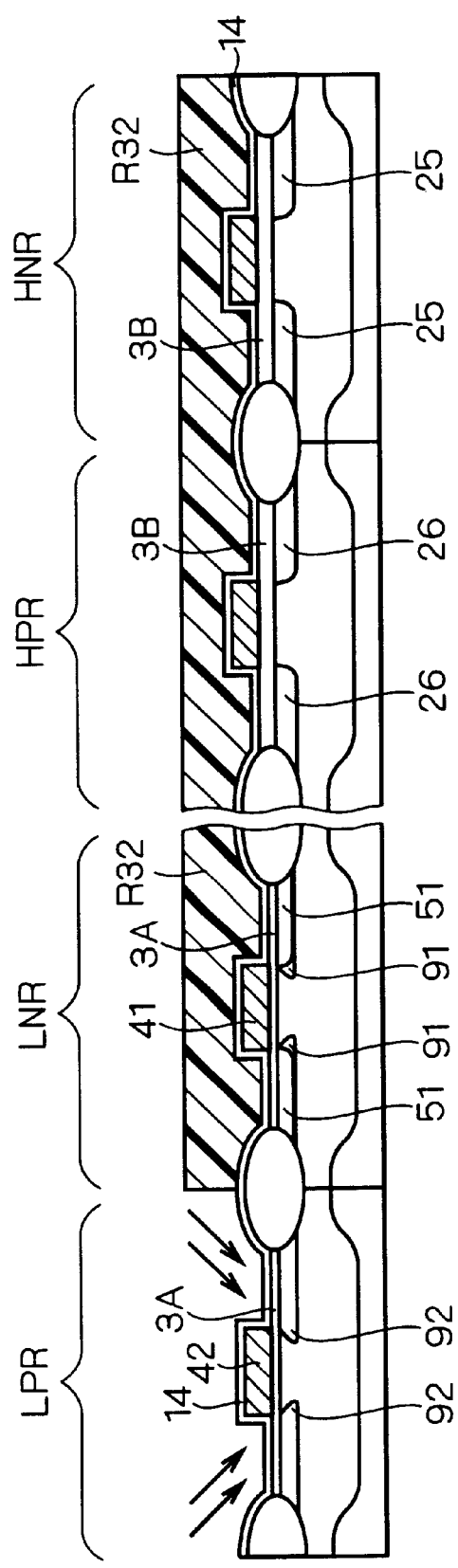

Thereafter, a resist mask R32 is formed to cover the low voltage NMOS region LNR, the high voltage NMOS region HNR and the high voltage PMOS region HPR by photolithography at a step shown in FIG. 37.

Subsequently, the silicon substrate 1 is inclined at a maximum angle of approximately 60°, and an N-type impurity ion such as arsenic or phosphorus is implanted into the silicon substrate 1 in the low voltage PMOS region LPR, thereby forming a pocket layer 92. For the conditions of implantation, an implantation energy is set to 1 keV to 50 keV and a dose amount is set to $1 \times 10^{13}$ to $1 \times 10^{4}/cm^2$.

The pocket layer 92 is formed to be extended in an oblique direction to a main surface of the silicon substrate 1 and has a tip portion extended to a region provided under the gate electrode 42.

Figure 38:
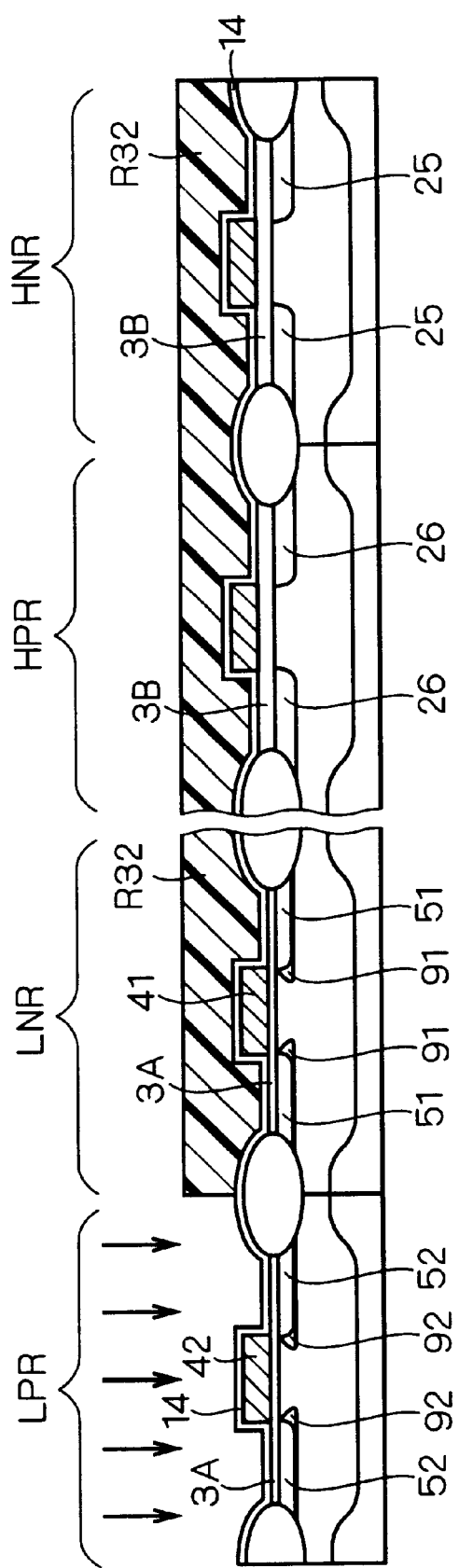
Figure 39:
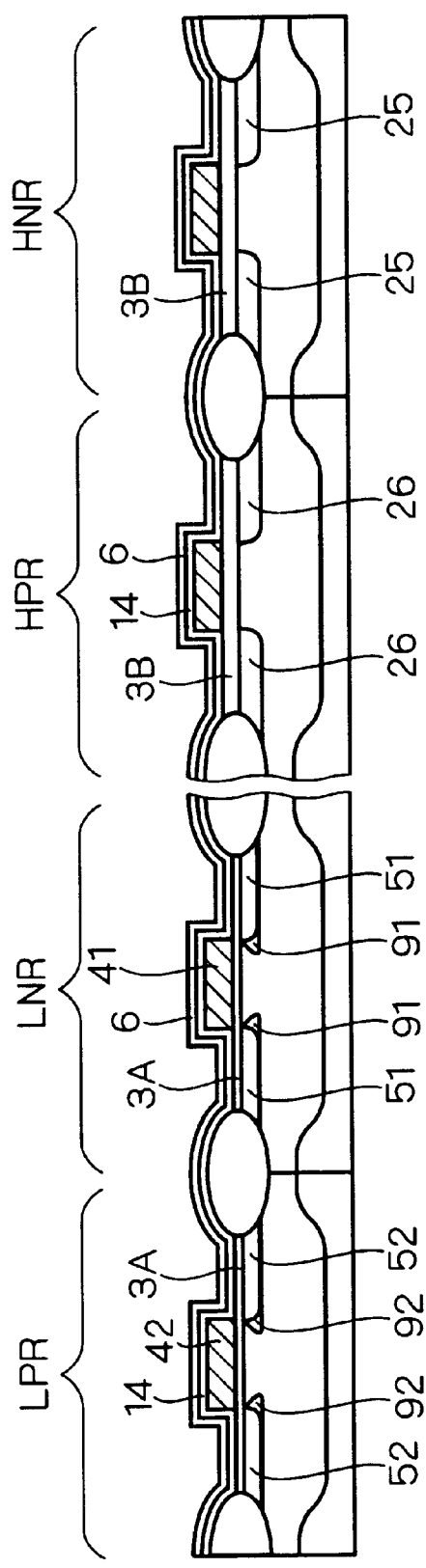

At a step shown in FIG. 38, next, the inclination of the silicon substrate 1 is restored and a boron or $BF_2$ ion is implanted into the silicon substrate 1 by using the gate electrode 42 as an implantation mask to form a pair of extension layers 52 in the surface of the silicon substrate 1. For the conditions of implantation, an implantation energy is set to 1 keV to 50 keV and a dose amount is set to $1 \times 10^{13}$ to $4 \times 10^{15}/cm^2$.

The extension layers 52 are provided opposite to each other by interposing a region of the silicon substrate 1 provided under the gate electrode 42 therebetween. The region of the silicon substrate 1 which is provided under the gate electrode 42 acts as a channel region.

Next, the resist mask R32 is removed. At a step shown in FIG. 39, then, a silicon oxide film 6 having a thickness of 10 to 200 nm is formed by the CVD method to cover a whole upper surface of the protective insulating film 14.

At a step shown in FIG. 40, subsequently, the protective insulating film 14 and the silicon oxide film 6 are removed by anisotropic etching together with the gate insulating film 3A provided over the silicon substrate 1 on the outside of side surfaces of the gate electrodes 41 and 42, and the protective insulating film 14 and the silicon oxide film 6 are removed by the anisotropic etching together with the gate insulating film 3B provided over the silicon substrate 1 on the outside of side surfaces of the gate electrodes 43 and 44 such that the protective insulating film 14 and the silicon oxide film 6 remain in aide wall portions of the gate electrodes 41 to 44. Thus, a side wall protective film 16 is formed.

The side wall protective film 16 has a two-layered structure constituted by the protective insulating film 14 and the silicon oxide film 6, and is also formed on the gate insulating film 3A provided over the silicon substrate 1 on the outside of the side surfaces of the gate electrodes 41 and 42 and on the gate insulating film 3B provided over the silicon substrate 1 on the outside of the side surfaces of the gate electrodes 43 and 44.

Through the same step as that described with reference to FIG. 29, subsequently, an N-type impurity ion such as arsenic is implanted into the silicon substrate 1 by using the gate electrode 43 and the side wall protective film 16 as implantation masks in the high voltage NMOS region HNR. Thus, a pair of main source-drain layers 27 are formed in the surface of the silicon substrate 1. Through the same step as that described with reference to FIG. 30, a P-type impurity ion such as boron or $BF_2$ is implanted into the silicon substrate 1 by using the gate electrode 44 and the side wall protective film 16 as implantation masks in the high voltage PMOS region HPR. Thus, a pair of main source-drain layers 28 are formed in the surface of the silicon substrate 1. Through the same step as that described with reference to FIG. 31, a P-type impurity ion such as boron or $BF_2$ is implanted into the silicon substrate 1 by using the gate electrode 42 and the side wall protective film 16 as implantation masks in the low voltage PMOS region LPR. Thus, a pair of main source-drain layers 72 are formed in the surface of the silicon substrate 1. Through the same step as that described with reference to FIG. 32, an N-type impurity ion such as arsenic is implanted into the silicon substrate 1 by using the gate electrode 41 and the side wall protective film 16 as implantation masks in the low voltage NMOS region LNR. Thus, a pair of main source-drain layers 71 are formed in the surface of the silicon substrate 1. The order of formation of the main source-drain layers 71, 72, 27 and 28 is not restricted to the foregoing.

Then, a heat treatment is carried out for 1 second to 360 minutes at a temperature of 800 to 1100° C. Thus, the main source-drain layers 71, 72, 27 and 28 are activated.

At a step shown in FIG. 41, next, a refractory metal film having a thickness of 1 to 16 nm, for example, a cobalt film (not shown) is formed to cover the whole surface of the silicon substrate 1, and is changed into a silicide by a high temperature treatment. Consequently, cobalt silicide films 8A and 10A are formed in contact portions of exposed surfaces of the silicon substrate 1 and the gate electrodes 41 and 42 with the cobalt film. Then, the cobalt film which has not been changed into the silicide is removed. Thus, the low voltage CMOS transistor 200A and the high voltage CMOS transistor 200B are obtained.

<D-2. Function and Effect>

While the extension layer 51 in the low voltage NMOS region LNR is formed prior to the formation of the extension layer 52 in the low voltage PMOS region LPR in the present embodiment as described above, the extension layer 51 is simply subjected to the etching for removing the resist mask R31 after the formation of the extension layer 51 at the step shown in FIG. 35. Then, the extension layer 51 is covered and protected with the protective insulating film 14 and is not therefore subjected to the etching. Thus, the etching amount is reduced.

As a result, a junction depth of the extension layer 51 is reduced so that a resistance value, that is, a parasitic resistance value can be prevented from being increased and a current driving capability can be prevented from being deteriorated. Thus, it is possible to prevent an operating speed of a semiconductor integrated circuit from being reduced.

Also in the present embodiment, the protective insulating film 14 may be formed immediately after the gate electrodes 41 and 44 are patterned on the NMOS region NR and the PMOS region PR and extension layers 51, 52, 25 and 26 may be formed in the NMOS region NR and the PMOS region PR in the same manner as in the second embodiment. It is apparent that the conditions of implantation and the heat treatment should be devised for forming the extension layers 51 and 26.

While the two kinds of CMOS transistors for operating at different supply voltages have been taken as an example for the description in the present embodiment, three kinds of supply voltages or more may be applied to the present invention. More specifically, if it is assumed that a CMOS transistor having the lowest supply voltage and a CMOS transistor having a second lowest supply voltage are used for the low voltage CMOS transistor 200A and the high voltage CMOS transistor 200B and the above-mentioned manufacturing method is employed, it is apparent that the number of times at which an extension layer of the CMOS transistor having the lowest supply voltage is subjected to etching can be reduced.

<D-3. Variant>

Although the protective insulating film 14 is formed by the CVD method in the above description, it may be formed by a thermal oxidizing method in place of the CVD method. By forming the protective insulating film 14 to be a protective insulating film on the substrate surface by the thermal oxidation capable of easily controlling a film thickness, it is possible to reduce a variation in a device characteristic which is caused by a variation in the film thickness.

Moreover, the protective insulating film to be provided on the surface of the substrate is not restricted to the silicon oxide film but a silicon nitride film formed by the CVD method may be used in place of the silicon oxide film.

The silicon nitride film is etched by aqueous ammonia peroxide with more difficulty than the silicon oxide film. Therefore, a thickness is set to 1 to 15 nm which is smaller than that in the case in which the silicon oxide film is used. Thus, the influence on the device characteristic can be relieved.

Furthermore, the silicon nitride film may be formed by a thermal nitriding method. By the thermal nitriding method capable of easily controlling a film thickness, it is possible to reduce a variation in a device characteristic which is caused by a variation in the film thickness.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device comprising the steps of:
   (a) defining a first NMOS region and a first PMOS region for forming at least a first NMOS transistor having an LDD structure and a first PMOS transistor having an LDD structure in a surface of a semiconductor substrate;
   (b) forming a first gate insulating film on at least said first NMOS region and said first PMOS region;
   (c) forming first and second gate electrodes on said first gate insulating film provided over said first NMOS region and said first PMOS region;
   (d) covering said first PMOS region with a first resist mask and implanting an N-type impurity ion by using said first gate electrode as an implantation mask, thereby forming a pair of N-type extension layers in said surface of said semiconductor substrate on an outside of a side surface of said first gate electrode;
   (e) removing said first resist mask and then forming a protective insulating film over a whole surface of said semiconductor substrate; and
   (f) covering said first NMOS region with a second resist mask and implanting a P-type impurity ion from above said protective insulating film by using said second gate electrode as an implantation mask, thereby forming a pair of P-type extension layers in said surface of said semiconductor substrate on an outside of a side surface of said second gate electrode.

2. The method of manufacturing a semiconductor device according to claim 1, wherein said step (a) includes the step of defining a second NMOS region for forming a second NMOS transistor having a higher operating voltage than that of said first NMOS transistor and a second PMOS region for forming a second PMOS transistor having a higher operating voltage than that of said first PMOS transistor, and said step (b) includes the step of forming a second gate insulating film having a greater thickness than that of said first gate insulating film over said second NMOS region and said second PMOS region, the method further comprising the step of:
   forming a pair of N-type impurity layers of said second NMOS transistor and a pair of P-type impurity layers of said second PMOS transistor in surfaces of said second NMOS region and said second PMOS region between said steps (b) and (c).

3. The method of manufacturing a semiconductor device according to claim 1, wherein said step (e) includes the step of forming said protective insulating film in a thickness of 1 nm to 20 nm.

4. The method of manufacturing a semiconductor device according to claim 3, wherein said step (e) includes the step of forming said protective insulating film as a silicon oxide film by a CVD method.

5. The method of manufacturing a semiconductor device according to claim 3, wherein said step (e) includes the step of forming said protective insulating film as a silicon oxide film by a thermal oxidizing method.

6. The method of manufacturing a semiconductor device according to claim 3, wherein said step (e) includes the step of forming said protective insulating film as a silicon nitride film by a CVD method.

7. The method of manufacturing a semiconductor device according to claim 3, wherein said step (e) includes the step of forming said protective insulating film as a silicon nitride film by a thermal nitriding method.

8. The method of manufacturing a semiconductor device according to claim 1, wherein said step (d) includes the step of forming said N-type extension layers to have a smaller depth than 0.1 μm, to have a maximum impurity concentration in the vicinity of said surface of said semiconductor substrate and to have said maximum impurity concentration set to $1 \times 10^{19}/cm^3$ to $1 \times 10^{21}/cm^3$.

9. The method of manufacturing a semiconductor device according to claim 8, wherein said step (a) includes the step of defining a second NMOS region for forming a second NMOS transistor having a higher operating voltage than that of said first NMOS transistor and a second PMOS region for forming a second PMOS transistor having a higher operating voltage than that of said first PMOS transistor, and said step (b) includes the step of forming a second gate insulating film having a greater thickness than that of said first gate insulating film over said second NMOS region and said second PMOS region, the method further comprising the step of:

forming a pair of N-type impurity layers of said second NMOS transistor and a pair of P-type impurity layers of said second PMOS transistor in surfaces of said second NMOS region and said second PMOS region between said steps (b) and (c).

* * * * *